(12) United States Patent
Yamada et al.

(10) Patent No.: US 8,742,446 B2
(45) Date of Patent: Jun. 3, 2014

(54) LIGHT EMITTING ELEMENT AND METHOD OF MANUFACTURING THE SAME

(75) Inventors: Jiro Yamada, Kanagawa (JP); Teiichiro Nishimura, Kanagawa (JP)

(73) Assignee: Sony Corporation, Tokyo (JP)

( * ) Notice: Subject to any disclaimer, the term of this patent is extended or adjusted under 35 U.S.C. 154(b) by 296 days.

(21) Appl. No.: 12/938,907

(22) Filed: Nov. 3, 2010

(65) Prior Publication Data

US 2011/0108877 A1 May 12, 2011

(30) Foreign Application Priority Data

Nov. 10, 2009 (JP) ................................ P2009-257268

(51) Int. Cl.
*H01L 51/50* (2006.01)
*H01L 27/32* (2006.01)

(52) U.S. Cl.
CPC ....... *H01L 27/3244* (2013.01); *H01L 2251/568* (2013.01)
USPC ........................... 257/99; 257/E33.06; 438/29

(58) Field of Classification Search
CPC ..... H01L 27/3244; H01L 33/46; H01L 33/28; H01L 33/62; H01L 2251/568
USPC .................... 257/79, 89, 99, E33.06; 438/29; 313/506
See application file for complete search history.

(56) References Cited

U.S. PATENT DOCUMENTS

| | | | |
|---|---|---|---|
| 6,262,441 B1 * | 7/2001 | Bohler et al. | 257/103 |
| 6,605,372 B1 * | 8/2003 | Kubota | 428/690 |
| 7,005,196 B1 | 2/2006 | Carter et al. | |
| 7,102,282 B1 | 9/2006 | Yamada et al. | |
| 7,138,203 B2 * | 11/2006 | Baars et al. | 429/434 |
| 7,234,984 B2 * | 6/2007 | Nishikawa et al. | 445/2 |
| 7,504,655 B2 * | 3/2009 | Parker et al. | 257/40 |
| 7,990,055 B2 * | 8/2011 | Boerner | 313/506 |
| 2004/0195576 A1 * | 10/2004 | Watanabe et al. | 257/79 |
| 2005/0211998 A1 * | 9/2005 | Daniels et al. | 257/89 |
| 2006/0214575 A1 * | 9/2006 | Kajiyama et al. | 313/506 |

FOREIGN PATENT DOCUMENTS

| | | |
|---|---|---|
| JP | 2001-035667 | 2/2001 |
| JP | 2002-033198 | 1/2002 |
| JP | 2003-092191 | 3/2003 |
| JP | 2003-109775 | 4/2003 |
| JP | 2005-209647 | 8/2005 |
| JP | 2006-338916 | 12/2006 |
| JP | 2009-054582 | 3/2009 |
| WO | 01/39554 | 5/2001 |

OTHER PUBLICATIONS

Japanese Office Action issued Jun. 25, 2013 in corresponding Japanese Patent Application No. 2009-257268.

* cited by examiner

*Primary Examiner* — John C Ingham
(74) *Attorney, Agent, or Firm* — K&L Gates LLP

(57) ABSTRACT

A light emitting element includes a first electrode, an organic layer formed on the first electrode, a resistance layer formed on the organic layer, a second electrode, and a conductive resin layer formed between the resistance layer and the second electrode.

38 Claims, 16 Drawing Sheets

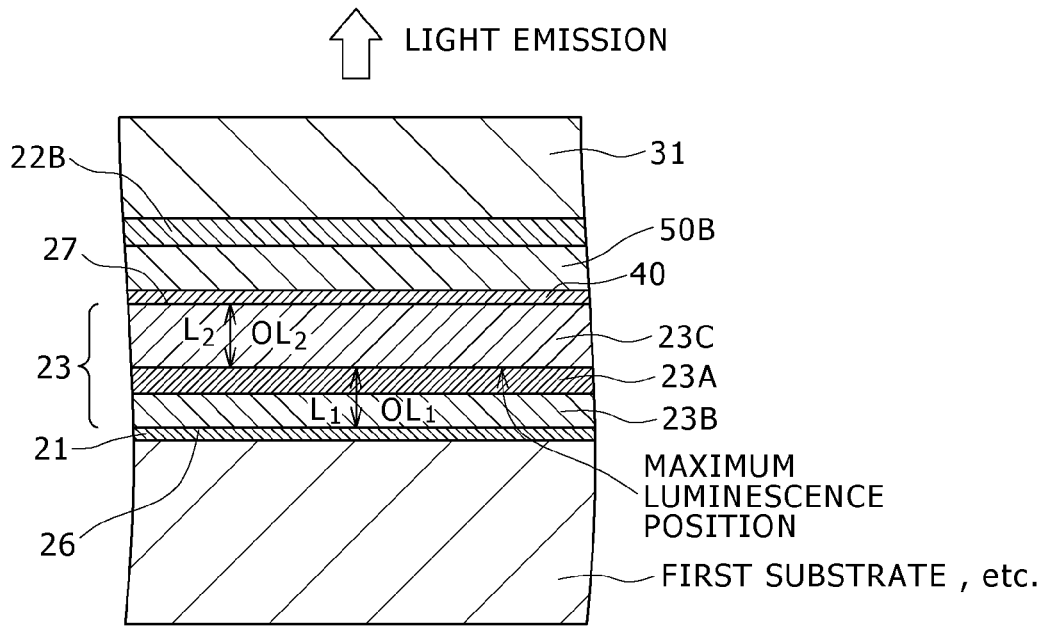
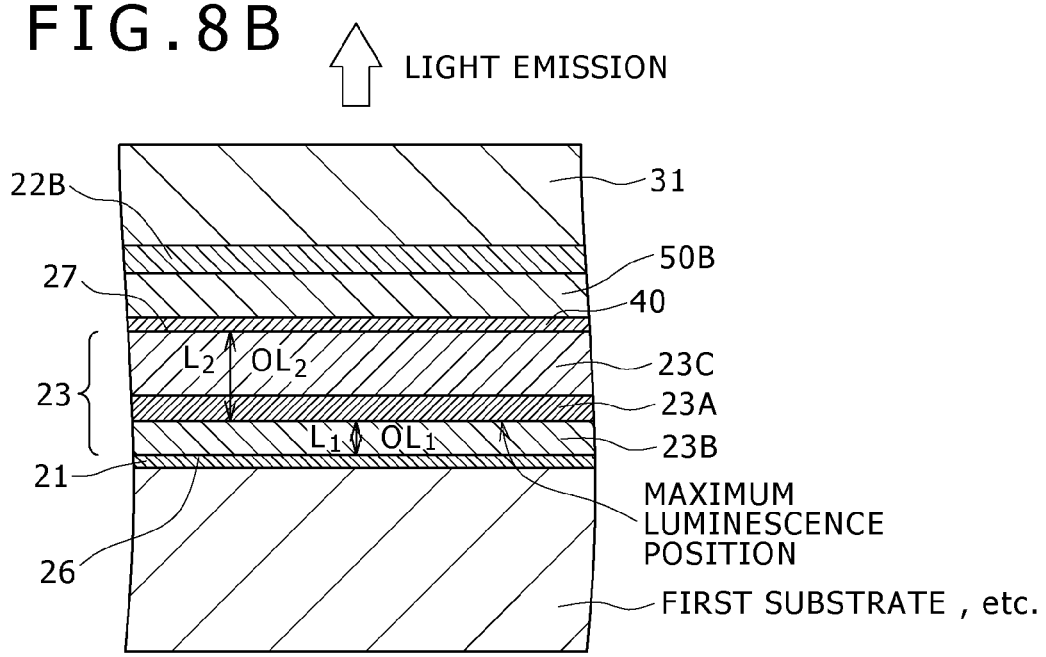

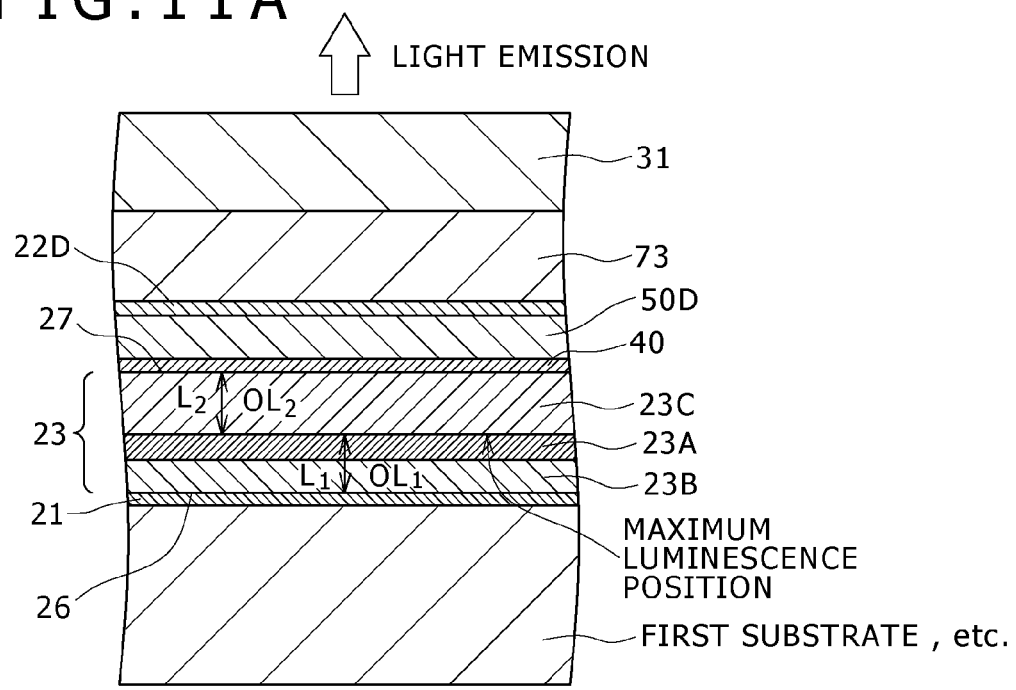
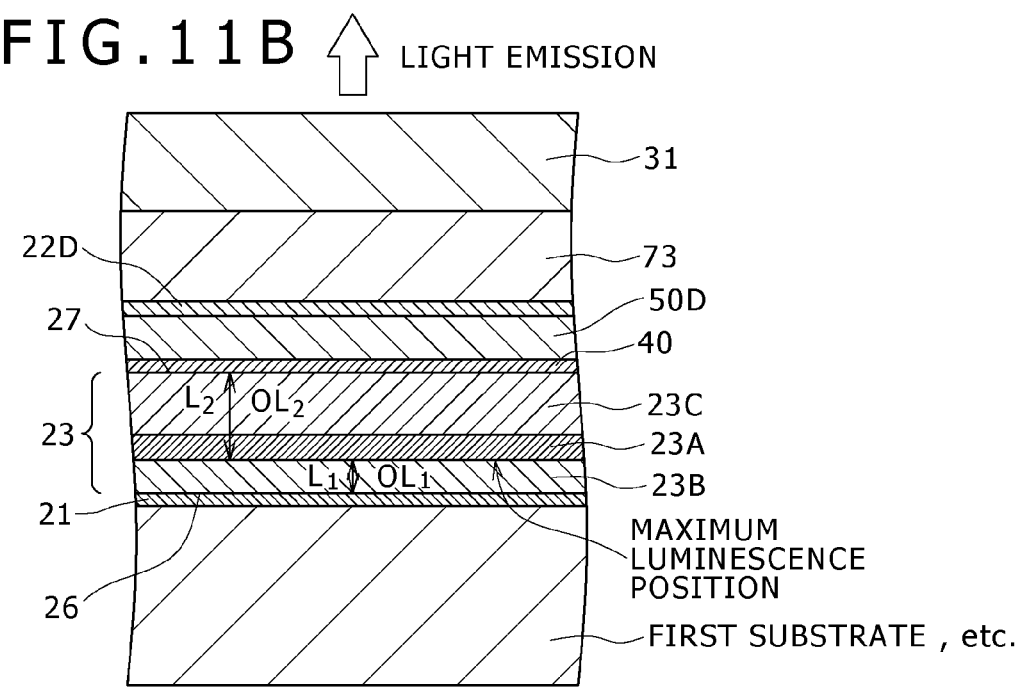

LIGHT EMITTING ELEMENT AND METHOD OF MANUFACTURING THE SAME

CROSS REFERENCES TO RELATED APPLICATIONS

The present application claims priority to Japanese Patent Application JP 2009-257268 filed on Nov. 10, 2009, the entire contents of which is hereby incorporated by reference.

BACKGROUND

The present disclosure relates to a light emitting element and a method of manufacturing the same. More particularly, the present disclosure relates to an organic electroluminescence element and a method of manufacturing the same.

In recent years, organic electroluminescence displays (hereinafter referred also to simply as "organic EL displays") using an organic electroluminescence element (hereinafter referred also to simply as "organic EL element") have been paid attention to as displays capable of substituting for liquid crystal displays. The organic EL displays are of the self-luminous type, and is characterized by small power consumption. In addition, the organic EL displays are considered to have sufficient response to high-definition, high-speed video signals. In view of these points, developments of organic EL displays for putting them to practical use and commercialization thereof are being conducted vigorously.

In general, an organic EL element has a structure in which a first electrode, an organic layer having a light emitting layer formed from an organic light emitting material, and a second electrode are stacked sequentially. In the organic EL elements, in addition, attempts to control the light generated in the light emitting layer so as to improve the purity of luminescent color or to enhance the luminous efficiency have been made by introducing a resonator structure, that is, by optimizing the respective thicknesses of the layers constituting the organic layer (refer to, for example, WO 01/39554 pamphlet (described as Patent Document 1 hereinafter)).

Here, a problem may arise in connection with the dependencies of chromaticity and luminance on viewing angle. That is, as the viewing angle increases, the peak wavelength in the spectrum of light emitted from an organic EL display may be shifted largely or the intensity of the light may be lowered considerably. It is desirable, therefore, to suppress the intensity of resonance to a level as low as possible, or, in other words, to make the thickness of the organic layer as small as possible (refer to the above-mentioned Patent Document 1). Where the organic layer is small in thickness, however, there is a problem that if a particle (foreign matter) or a projected part is present on the first electrode as schematically shown in FIG. 16, the coverage of the organic layer would become imperfect, possibly leading to short circuit between the first electrode and the second electrode. If such a short circuit occurs, in an organic EL display based on the active matrix system, the pixel involving the short circuit constitutes a defective pixel, thereby deteriorating the display quality of the organic EL display. In a passive-matrix type organic EL display, on the other hand, the pixel involving the short circuit would constitute a missing line, thereby again deteriorating the display quality of the organic EL display. Such a problem is exaggerated particularly in large-type organic EL displays, because of severer requirements as to viewing angle characteristics and a reduced number of allowable defects per unit area.

Hitherto, a variety of approaches have been tried to restrain short circuits between the first electrodes and the second electrodes. For instance, Japanese Patent Laid-open No. 2001-035667 (referred to as Patent Document 2 hereinafter) discloses a technology of intermittently providing a high-resistance layer between anodes and an organic film, in a bottom emission type organic EL display. In addition, Japanese Patent Laid-open No. 2006-338916 (referred to as Patent Document 3 hereinafter) discloses a technology of forming anodes in a two-layer structure and setting the layer constituting the anodes nearer to an organic layer to be high in resistance, in a top emission type organic EL display. Further, Japanese Patent Laid-open No. 2005-209647 (referred to as Patent Document 4 hereinafter) discloses a technology of forming cathodes in a two-layer structure and setting the layer constituting the anodes nearer to an organic layer to be high in resistance, in a bottom emission type organic EL display.

SUMMARY

However, even in the case where a high-resistance layer is intermediately provided between anodes and cathodes as disclosed in the above-mentioned provisional patent publications, the above-mentioned problems cannot be solved when this configuration is combined with a resonator structure. Specifically, in order to enhance the coverage of the high-resistance layer for particles (foreign matters) or projected parts so as to securely prevent generation of defects in display, it may be necessary to sufficiently enlarge the thickness of the high-resistance layer. If the thickness of the high-resistance layer is too large, however, a load on a process basis would be increased and the manufacturing cost would also be increased. In addition, while the second electrode is often composed of a transparent conductive material such as ITO, the electric resistivity of such a transparent conductive material is higher than those of metals. Therefore, a further reduction in the electric resistivity of the second electrode is keenly demanded.

Thus, there is a desire for a light emitting element which is so configured or structured that short circuit between a first electrode and a second electrode is prevented from occurring, even if a particle or a projected part is present on the first electrode, and which can be manufactured at a reduced cost and without any special manufacturing process, and for a method of manufacturing the light emitting element.

In a first embodiment, a light emitting element includes a first electrode, an organic layer formed on the first electrode, a resistance layer formed on the organic layer, a second electrode, and a conductive resin layer formed between the resistance layer and the second electrode.

A method of manufacturing a light emitting element according to the first embodiment includes forming a first section by forming a first electrode, forming an organic layer on the first electrode, and forming a resistance layer on the organic layer. The method also includes forming a second section by forming a second electrode, and joining the first and second sections by providing a conductive resin layer between the resistance layer and the second electrode.

In the light emitting element according to the first embodiment, the conductive resin layer is formed between the resistance layer and the second electrode, so that secure conduction can be attained between the second electrode and the resistance layer. In addition, since the conductive resin layer is formed, a reduction in the overall electric resistivity of the second electrode, which is formed from a transparent conductive material such as ITO, and the conductive resin layer can be promised. Besides, in the method of manufacturing the light emitting element according to the first embodiment, it suffices to prepare in advance the second substrate formed with the second electrode. In other words, it is unnecessary to form the second electrode on the upper side of the organic layer. Therefore, it is possible not only to prevent the organic layer from being damaged but also to form the second electrode having high quality and excellent properties.

In a second embodiment, a light emitting element includes a first electrode, an organic layer formed on the first electrode, a resistance layer formed on the organic layer, and a second electrode including a conductive resin material. The second electrode is formed on the resistance layer.

A method of manufacturing a light emitting element according to the second embodiment includes forming a first section by forming a first electrode, forming an organic layer on the first electrode, and forming a resistance layer on the organic layer. The method also includes forming a second section by forming a second electrode on a substrate, the second electrode including a conductive resin material, and joining the first and second sections by connecting the second electrode to the resistance layer.

In the light emitting element according to the second embodiment, the second electrode is formed from a conductive resin material. Therefore, a reduction in the manufacturing cost of the second electrode can be promised, as compared with a second electrode formed from a transparent conductive material such as ITO, for example. In addition, in the method of manufacturing the light emitting element according to the second embodiment, the resistance layer and the second substrate are adhered to each other by the second electrode which is formed from a conductive resin material. In other words, it is unnecessary to form the second electrode on the upper side of the organic layer. Consequently, the organic layer can be prevented from being damaged.

In a third embodiment, a light emitting element includes a first electrode, an organic layer formed on the first electrode, a resistance layer including a high-resistance resin material, the resistance layer being formed on the organic layer, and a second electrode formed on the resistance layer.

A method of manufacturing a light emitting element of the third embodiment includes forming a first section by forming a first electrode, forming an organic layer on the first electrode, and forming a second section by forming a second electrode. The method also includes joining the first and second sections by providing a resistance layer including a high-resistance resin material between the organic layer and the second electrode.

In the light emitting element according to the third embodiment, the resistance layer is formed from a resin material having a high electric resistance. Therefore, it is needless to especially enlarge the thickness of the resistance layer for the purpose of enhancing the coverage. Accordingly, an increase in the load on a process basis is avoided, and an increase in the manufacturing cost is obviated. Besides, in the method of manufacturing the light emitting element according to the third embodiment, the organic layer and the second electrode are adhered to each other by the resistance layer which is formed from a resin material having a high electric resistance. Therefore, excellent coverage can be achieved.

In a fourth embodiment, a light emitting element includes a first electrode, an organic layer formed on the first electrode, a resistance layer formed on the organic layer, a second electrode formed on the resistance layer, an auxiliary electrode, and a conductive rib formed between and electrically connecting the auxiliary electrode to the second electrode.

A method of manufacturing a light emitting element of the fourth embodiment includes forming a first section by forming a first electrode, forming an organic layer on the first electrode, forming a resistance layer on the organic layer, and forming a second electrode on the resistance layer. The method also includes forming a second section by forming at least one auxiliary electrode, forming a conductive rib on the auxiliary electrode, and joining the first and second sections by connecting the conductive rib to the second electrode.

In the light emitting element according to the fourth embodiment, an auxiliary electrode is formed on the upper side of the second electrode, and the auxiliary electrode and the second electrode are electrically connected to each other by a conductive rib. Therefore, a reduction in the overall manufacturing cost of the second electrode and the auxiliary electrode and the rib can be promised, as compared with a second electrode formed from a transparent conductive material such as ITO, for example. In addition, in the method of manufacturing the light emitting element according to the fourth embodiment, the first substrate and the second substrate are joined to each other in the condition where the rib and the second electrode are in contact with each other. Therefore, a reduction in the overall manufacturing cost of the second electrode and the auxiliary electrode and the rib can be promised.

In the light emitting element or the manufacturing method thereof according to the first to fourth embodiments, the resistance layer is formed between the organic layer and the second electrode. Even in the case where a foreign matter (particle) or a projected part is present on the first electrode or where a step is present there so that the coverage of the organic layer is imperfect, a voltage can be securely impressed on the organic layer from the second electrode, and short circuit between the first electrode and the second electrode can be prevented from occurring.

In another embodiment, a light emitting element includes a first electrode, an organic layer formed on the first electrode, a second electrode, and a conductive resin layer formed between the organic layer and the second electrode.

In another embodiment, a method of manufacturing a light emitting element includes forming a first section by forming a first electrode, forming an organic layer on the first electrode. The method also includes forming a second section by forming a second electrode, and joining the first and second sections by providing a conductive resin material between the organic layer and the second electrode.

Additional features and advantages are described herein, and will be apparent from the following Detailed Description and the figures.

BRIEF DESCRIPTION OF THE FIGURES

FIGS. 8A and 8B are schematic partial sectional views of a light emitting element in Example 2;

FIGS. 11A and 11B are schematic partial sectional views of a light emitting element in Example 6;

DETAILED DESCRIPTION

Figure 1:
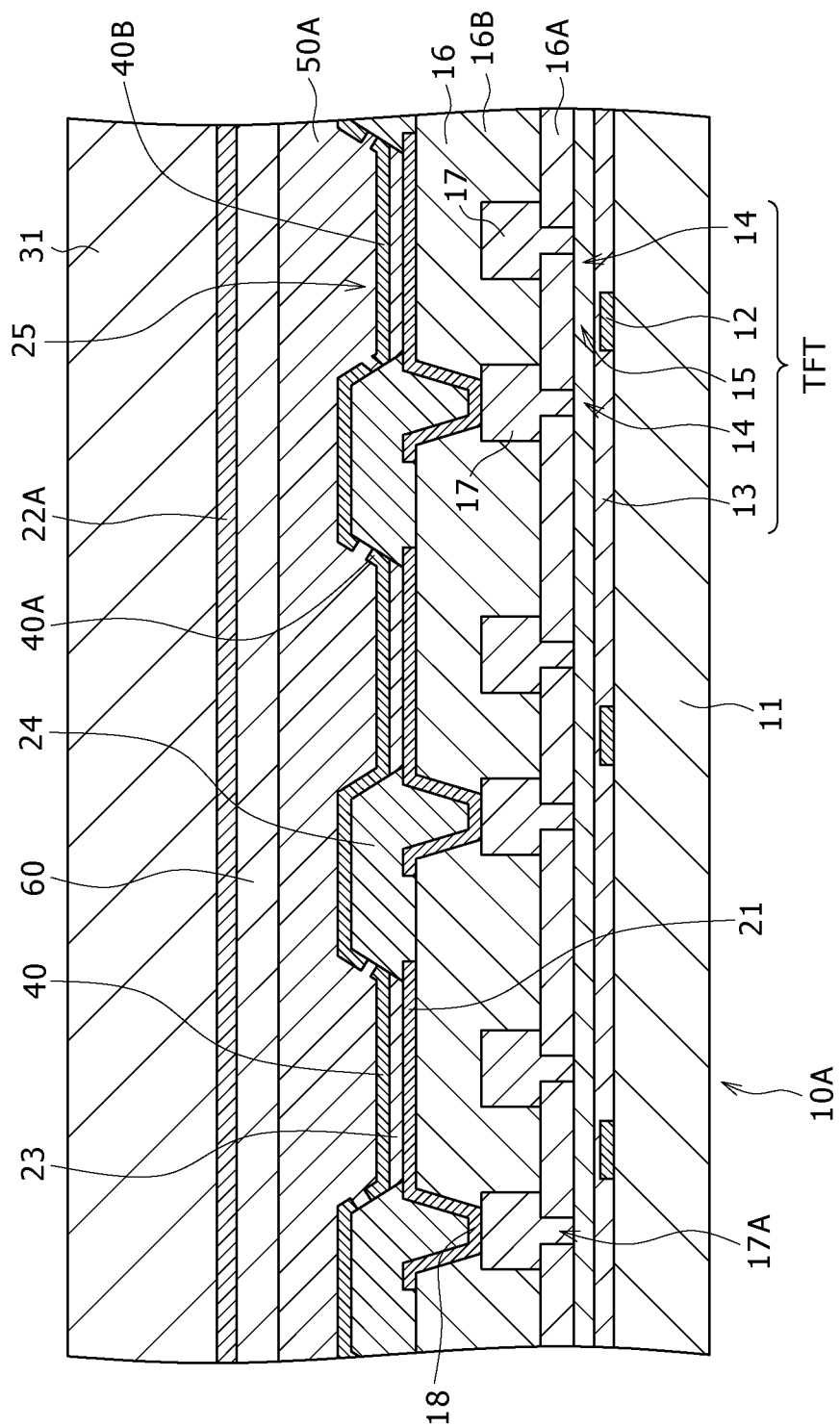
FIG. 1 is a schematic partial sectional view of an organic electroluminescence display in Example 1.

Now, the present embodiments will be described below, based on Examples and referring to the drawings. The various numerical values and materials in the following Examples are set forth merely as examples. Incidentally, the description will be made in the following order.

1. General description of a light emitting element and a manufacturing method thereof according to an embodiment
2. Example 1 (a light emitting element according to a first embodiment and a method of manufacturing the light emitting element according to the first embodiment)
3. Example 2 (a light emitting element according to a second embodiment and a method of manufacturing the light emitting element according to the second embodiment)
4. Example 3 (a modification of Example 2)
5. Example 4 (a light emitting element according to a third embodiment and a method of manufacturing the light emitting element according to the third embodiment)
6. Example 5 (a modification of Example 4)
7. Example 6 (a light emitting element according to a fourth embodiment and a method of manufacturing the light emitting element according to the fourth embodiment)
8. Example 7 (a modifications of Examples 1 to 6)
9. Example 8 (another modification of Examples 1 to 6)
10. Example 9 (a further modification of Examples 1 to 6, and others)

[General description of a light emitting element and a manufacturing method thereof]

In the following description, a light emitting element according to the first embodiment and a light emitting element obtained by a method of manufacturing a light emitting element according to the first embodiment will sometimes be referred to generically as "the light emitting elements according to the first embodiment." In addition, a light emitting element according to the second embodiment and a light emitting element obtained by a method of manufacturing a light emitting element according to the second embodiment will sometimes be referred to generically as "the light emitting elements according to the second embodiment." Further, a light emitting element according to the third embodiment and a light emitting element obtained by a method of manufacturing a light emitting element according to the third embodiment will sometimes be referred to generically as "the light emitting elements according to the third embodiment." Besides, a light emitting element according to the fourth embodiment and a light emitting element obtained by a method of manufacturing a light emitting element according to the fourth embodiment will sometimes be referred to generically as "the light emitting elements according to the fourth embodiment." In addition, in the organic electroluminescence display (organic EL display), a configuration may be adopted in which a second substrate is disposed on the upper side of a second electrode. Incidentally, the organic EL display thus configured will sometimes be referred to as "the top emission type organic EL display," for convenience. Or, alternatively, a configuration may be adopted in which a first substrate is disposed on the lower side of a second electrode. Incidentally, the organic EL display thus configured will sometimes be referred to as "the bottom emission type organic EL display," for convenience.

In the light emitting elements according to the first embodiment, a configuration may be adopted in which the conductive resin layer has an electric resistivity of $1 \times 10^{-4}$ to $1 \times 10^{2}$ $\Omega \cdot m$ ($1 \times 10^{-2}$ to $1 \times 10^{4}$ $\Omega \cdot cm$), and the conductive resin layer has a thickness of $1 \times 10^{-6}$ to $1 \times 10^{-4}$ m. With the electric resistivity and the thickness of the conductive resin layer set in these ranges, conduction between the second electrode and the resistance layer can be more assured. Besides, in the light emitting elements according to the first embodiment including the just-mentioned configuration, the material constituting the resistance layer has an electric resistivity of $1 \times 10^{2}$ to $1 \times 10^{6}$ $\Omega \cdot m$ ($1 \times 10^{4}$ to $1 \times 10^{8}$ $\Omega \cdot cm$), preferably $1 \times 10^{4}$ to $1 \times 10^{5}$ $\Omega \cdot m$ ($1 \times 10^{6}$ to $1 \times 10^{7}$ $\Omega \cdot cm$), and has a thickness of 0.1 to 2 µm, preferably 0.3 to 1 µm. Examples of the material which can be used to constitute the conductive resin layer include thermosetting adhesives such as acrylic adhesives, epoxy adhesives, urethane adhesives, silicone adhesives, cyanoacrylate adhesives, etc., and UV-curing adhesives, admixed with a conductive polymer such as polypyrrole, polyether, polyaniline, polythiophene, etc. in such a concentration as to show a predetermined resistance, and copolymers obtained by copolymerization of an acrylic, epoxy, urethane, silicone, or cyanoacrylate polymer with a conductive polymer such as polymers of pyrrole, thiophene, etc. The conductive resin layer can be formed, for example, based on an ODF (One Drop Fill) system in which a bank (or a continuous projected part) is formed from a resin called a sealing agent, and the conductive resin layer is formed on the inside of the bank by a coating method. Incidentally, in the method of manufacturing the light emitting element according to the first embodiment, the conductive resin layer may be formed over the resistance layer based on the above-mentioned method, then the conductive resin layer and the second electrode may be stacked on each other, and the resistance layer and the second electrode can be adhered to each other through the conductive resin layer, based on an appropriate method depending on the material constituting the conductive resin layer (for example, by heating or by irradiation with energy rays such as UV rays, here and hereafter). Alternatively, in the method of manufacturing the light emitting element according to the first embodiment, the conductive resin layer may be formed on the second electrode based on the above-mentioned method, then the conductive resin layer and the resistance layer are stacked on each other, and the resistance layer and the second electrode can be adhered to each other through the conductive resin layer, based on an appropriate method depending on the material constituting the conductive resin layer. Or, in the method of manufacturing the light emitting element according to the first embodiment, the second electrode and the resistance layer may be stacked over each other, with the conductive resin layer composed of a sheet-like material therebetween, based on the above-mentioned method, and the resistance layer and the second electrode can be adhered to each other through the conductive resin layer, based on an appropriate method depending on the material constituting the conductive resin layer.

Besides, in the light emitting elements according to the second embodiment, a configuration may be adopted in which the conductive resin material has an electric resistivity of not more than $5\times10^{-3}$ Ω·m (not more than $5\times10^{-1}$ Ω·m), and the second electrode has a thickness of 1 to 100 μm. With the electric resistivity of the conductive resin material and the thickness of the second electrode set in these ranges, the second electrode can assuredly function as an electrode. In the light emitting elements according to the second embodiment including the just-mentioned configuration, the material constituting the resistance layer may have an electric resistivity of $1\times10^2$ to $1\times10^6$ Ω·m ($1\times10^4$ to $1\times10^8$ Ω·m), preferably $1\times10^4$ to $1\times10^5$ Ω·m ($1\times10^6$ to $1\times10^7$ Ω·cm), and the resistance layer may have a thickness of 0.1 to 2 μm, preferably 0.3 to 1 μm. For instance, in the case of a [modified ZET structure 1-2], the conductive resin material may include a copolymer obtained by copolymerization of an acrylic, epoxy, urethane, silicone, or cyanoacrylate polymer with a conductive polymer such as polymers of pyrrole, thiophene, etc. The conductive resin layer can be formed, for example, based on the ODF system. Or, in the case of a [modified ZET structure 2], the conductive resin material may be obtained by synthesizing a copolymer obtained by copolymerization of an acrylic, epoxy, urethane, silicone, or cyanoacrylate polymer with a conductive polymer such as polymers of pyrrole, thiophene, etc. and, further, introducing a crosslinking agent (N,N'-methylenebisacrylamide, ethylene glycol dimethacrylate, or the like) for gelation into the copolymer. For instance, the conductive resin layer can be formed based on a method in which, after irradiation with UV rays, the conductive resin layer is formed based on the ODF system using a heat-curable sealing agent, and the conductive resin layer is gelled by heating. Incidentally, in the method of manufacturing the light emitting element according to the second embodiment, the second electrode may be formed over the resistance layer based on the above-mentioned method, then the second electrode and the second substrate are stacked on each other, and the resistance layer and the second substrate can be adhered to each other through the second electrode, based on an appropriate method depending on the conductive resin material constituting the second electrode. Alternatively, in the method of manufacturing the light emitting element according to the second embodiment, the resistance layer and the second substrate may be stacked over each other through the second electrode composed of a sheet-like material based on the above-mentioned method, and the resistance layer and the second substrate can be adhered to each other through the second electrode, based on an appropriate method depending on the conductive resin material constituting the second electrode. Or, in the method of manufacturing the light emitting element according to the 2'-th embodiment, the second electrode may be formed over the second substrate based on the above-mentioned method, then the second electrode and the resistance layer are stacked on each other, and the resistance layer and the second substrate can be adhered to each other through the second electrode, based on an appropriate method depending on the conductive resin material constituting the second electrode. A configuration may be adopted in which an appropriate electron injection layer is provided between the second electrode and the resistance layer so as to enhance electron injection performance.

In the light emitting elements according to the first embodiment, the second embodiment or the fourth embodiment (described later), the resistance layer desirably includes an oxide semiconductor. Alternatively, the resistance layer may include niobium oxide ($Nb_2O_5$), titanium oxide ($TiO_2$), molybdenum oxide ($MoO_2$, $MoO_3$), tantalum oxide ($Ta_2O_5$), hafnium oxide (HfO), IGZO, a niobium oxide-titanium oxide mixture, a titanium oxide-zinc oxide (ZnO) mixture, a silicon oxide ($SiO_2$)-tin oxide ($SnO_2$) mixture, or an appropriate combination of these materials. Incidentally, the electric resistivity of the material constituting the resistance layer may more specifically be determined by taking into account the value of the voltage drop generated across the resistance layer at the time of driving the light emitting element or organic EL element. The value of the voltage drop is, for example, 0.05 to 1.0 V.

Or, in the light emitting elements according to the first embodiment, the second embodiment or the fourth embodiment (described later), the resistance layer may have a stacked structure of a first resistance layer and a second resistance layer in this order from the organic layer side, with the second resistance layer being higher than the first resistance layer in electric resistivity. Alternatively, the resistance layer may have a stacked structure of a first resistance layer, a second resistance layer and a third resistance layer in this order from the organic layer side, with the second resistance layer being higher than the first resistance layer in electric resistivity and being higher than the third resistance layer in electric resistivity. Here, examples of the material constituting the first resistance layer and the third resistance layer include zinc oxide, tin oxide, niobium oxide, titanium oxide, molybdenum oxide, tantalum oxide, a niobium oxide-titanium oxide mixture, a titanium oxide-zinc oxide mixture, and a silicon oxide-tin oxide mixture, and a film of such a material may be formed under a lowered oxygen partial pressure. Examples of the material constituting the second resistance layer include niobium oxide, titanium oxide, molybdenum oxide, tantalum oxide, a niobium oxide-titanium oxide mixture, a titanium oxide-zinc oxide mixture, and a silicon oxide-tin oxide mixture. Here, let the electric resistivities of the first, second, and third resistance layers be $R_1$ (Ω·m), $R_2$ (Ω·m), and $R_3$ (Ω·m), respectively, then it is desirable that the relations of, for example, $$1\times10^{-3} \leq R_1/R_2 \leq 1\times10^{-1}$$

$$1\times10^{-3} \leq R_3/R_2 \leq 1\times10^{-1}$$

are satisfied. With the resistance layer set to have a multilayer structure in this manner, optimization of the resistance of the resistance layer as a whole can be promised. Consequently, it is possible to reduce the voltage drop across the resistance layer and to promise a lowering in the driving voltage.

In the light emitting elements according to the first or second embodiment or according to the third or fourth embodiment (described later), in the case where the resistance layer has a stacked structure composed at least of a first resistance layer and a second resistance layer, it is desirable, where efficiency is deemed important, that the relations of:

$$-0.6 \leq n_0 - n_1 \leq -0.4$$

$$0.4 \leq n_1 - n_2 \leq 0.9$$

are satisfied, where $n_1$ is the refractive index of the material constituting the first resistance layer, $n_2$ is the refractive index of the material constituting the second resistance layer, and $n_0$ is the refractive index of the material constituting an uppermost layer of the organic layer. Where viewing angle is deemed important, it is desirable that the relations of:

$$-0.2 \leq n_0 - n_1 \leq 0.2$$

$$0.2 \leq n_1 - n_2 \leq 0.4$$

are satisfied.

Further, in the light emitting elements according to the third embodiment, the resin material constituting the resistance layer may have an electric resistivity of $1 \times 10^1$ to $1 \times 10^4$ $\Omega \cdot m$ ($1 \times 10^3$ to $1 \times 10^6$ $\Omega \cdot m$), and the resistance layer may have a thickness of $1 \times 10^{-6}$ to $1 \times 10^{-4}$ m. In the case of a [modified ZET structure 3], examples of the resin material having a high electric resistance (high-resistance resin material) include thermosetting adhesives such as acrylic adhesives, epoxy adhesives, urethane adhesives, silicone adhesives, cyanoacrylate adhesives, etc., and UV-curing adhesives, admixed with a conductive polymer such as polypyrrole, polyether, polyaniline, polythiophene, etc. in such a concentration as to show a predetermined resistance. A layer of the high-resistance resin material can be formed, for example, based on the ODF system. Or, in the case of a [modified ZET structure 4], the resin material having a high electric resistance (high-resistance resin material) may be obtained by admixing a thermosetting adhesive such as acrylic adhesive, epoxy adhesive, urethane adhesive, silicone adhesive, cyanoacrylate adhesive, etc. or a UV-curing adhesive with a conductive polymer such as polypyrrole, polyether, polyaniline, polythiophene, etc. in such a concentration as to show a predetermined resistance and introducing a crosslinking agent (N,N'-methylenebisacrylamide, ethylene glycol dimethacrylate, or the like) for gelation into the admixture. A layer of the high-resistance resin material can be formed, for example, by a method in which, after irradiation with UV rays, a layer of the high-resistance resin material is formed based on the ODF system using a hear-curable sealing agent, and the layer of the high-resistance resin material is gelled by heating. Incidentally, in the method of manufacturing the light emitting element according to the third embodiment, based on the above-mentioned method, a layer of the resin material having a high electric resistance may be formed on the organic layer, then the resistance layer and the second electrode may be stacked on each other, and the organic layer and the second electrode can be adhered to each other through the resistance layer, based on an appropriate method depending on the resin material constituting the resistance layer. Or, in the method of manufacturing the light emitting element according to the third embodiment, the organic layer and the second electrode may be stacked over each other through the resistance layer composed of a sheet-like material based on the above-mentioned method, and the organic layer and the second electrode can be adhered to each other through the resistance layer, based on an appropriate method depending on the resin material constituting the resistance layer. Or, in the method of manufacturing the light emitting element according to the 3'-th embodiment, a layer of the resin material having a high electric resistance may be formed over the second electrode based on the above-mentioned method, then the resistance layer and the organic layer are stacked on each other, and the organic layer and the second electrode can be adhered to each other through the resistance layer, based on an appropriate method depending on the resin material constituting the resistance layer. Incidentally, the resistance layer may have a stacked structure of a first resistance layer and a second resistance layer in this order from the organic layer side, and the second resistance layer may be higher than the first resistance layer in electric resistivity. Or, the resistance layer may have a stacked structure of a first resistance layer, a second resistance layer and a third resistance layer in this order from the organic layer side, and the second resistance layer may be higher than the first resistance layer in electric resistivity and higher than the third resistance layer in electric resistivity. Here, let the electric resistivities of the first, second, and third resistance layers be $R_1$ ($\Omega \cdot m$), $R_2$ ($\Omega \cdot m$), and $R_3$ ($\Omega \cdot m$), respectively, then it is desirable that the relations of, for example, $$1 \times 10^{-3} \leq R_1/R_2 \leq 1 \times 10^{-1}$$

$$1 \times 10^{-3} \leq R_3/R_2 \leq 1 \times 10^{-1}$$

are satisfied.

In the light emitting elements according to the fourth embodiment, the conductive ribs can be obtained, for example, by a method in which a film of a conductive material such as Al, Ag, Cu, Ti, W, Ta, Mo, ITO, IZO, $SnO_2$, ZnO:Al, etc. is formed on the surface of ribs formed of a polyimide resin or an acrylic resin, based on a known method. The height of the ribs may be, for example, 0.1 to 100 μm. In addition, in the method of manufacturing the light emitting element according to the fourth embodiment, the joining of the first substrate and the second substrate can be carried out, for example, by use of frit glass, a low-melting metallic material (e.g., a metallic material generally having a melting point in a temperature range of 120 to 400° C., such as indium (In)), or an adhesive material, e.g., a thermosetting adhesive such as acrylic adhesive, epoxy adhesive, urethane adhesive, silicone adhesive, cyanoacrylate adhesive, etc. or a UV-curing adhesive. The frit glass is a high-viscosity pasty material having glass particulates dispersed in a binder, and examples thereof include $B_2O_3$—PbO frit glass, and $SiO_2$—$B_2O_3$—PbO frit glass. When the pasty material is applied in a predetermined pattern and the organic binder is removed by burning, a solid joint material layer is obtained. The formation of the conductive ribs on the auxiliary electrode can be carried out, for example, based on a method in which a photosensitive polyimide resin is subjected to exposure to light and development, a method in which a rib-forming material is applied and patterned by use of screen printing, or the like method. A space between the second substrate and the second electrode may be filled up with an adhesive layer (sealing layer) or filled up with an inert gas such as nitrogen gas. Examples of the material which can be used to constitute the adhesive layer (sealing layer) include thermosetting adhesives such as acrylic adhesive, epoxy adhesive, urethane adhesive, silicone adhesive, cyanoacrylate adhesive, etc., and UV-curing adhesives.

In the light emitting elements according to the first embodiment, the light emitting elements according to the second embodiment, the light emitting elements according to the third embodiment, or the light emitting elements according to the fourth embodiment (these light emitting elements will sometimes be referred to generically as "the light emitting elements according to the embodiment") including the above-described various preferable configurations, a configuration may be adopted in which:

a semitransmitting-reflective film having a mean thickness of 1 to 6 nm is formed between the resistance layer and the second electrode;

the first electrode reflects light coming from the light emitting layer; and the second electrode permits the light transmitted through the semitransmitting-reflective film to be transmitted therethrough.

Besides, in the light emitting elements according to the present embodiment in the above-mentioned form, a configuration may be adopted in which the light emitted from the light emitting layer is resonated between a first interface composed of an interface between the first electrode and the organic layer and a second interface composed of an interface between the semitransmitting-reflective film and the organic layer, and part of the resonated light is emitted from the semitransmitting-reflective film. Here, the semitransmitting-reflective film may be configured to contain an alkali metal or alkaline earth metal and silver (Ag) [for example, magnesium (Mg) and silver (Ag)], or to contain magnesium (Mg) and calcium (Ca) [for example, Mg—Ag or Mg—Ca], or to contain aluminum (Al) or silver (Ag). Where the semitransmitting-reflective film is composed of magnesium-silver, the volume ratio Mg:Ag of magnesium to silver may be in the range of from 5:1 to 30:1, for example. On the other hand, where the semitransmitting-reflective film is composed of magnesium-calcium, the volume ratio Mg:Ca of magnesium to calcium may be in the range of from 2:1 to 10:1, for example. The semitransmitting-reflective film is normally distinguished as "film" in the light emitting element, the semitransmitting-reflective film may in some cases be in a state in which an uppermost layer part of the organic layer and the semitransmitting-reflective film and a lower layer part of the resistance layer are present mixedly, or in a state in which an uppermost layer part of the organic layer and magnesium constituting the semitransmitting-reflective film and the resistance layer are present mixedly and silver particles are present dispersedly.

Here, the interface between the first electrode and the organic layer is referred to as "first interface," the interface between the semitransmitting-reflective film and the organic layer (where the semitransmitting-reflective film is not formed, the interface between the resistance layer and the organic layer) is referred to as "second interface," the interface between the semitransmitting-reflective film and the resistance layer is referred to as "third interface," and the interface between the first resistance layer and the second resistance layer is referred to as "fourth interface." Normally, the light emitted from the light emitting layer is resonated between the first interface and the second interface. When the semitransmitting-reflective layer is reduced in thickness, however, the value of the mean light transmittance of the semitransmitting-reflective film becomes so high that most part of the light emitted from the light emitting layer is transmitted through the semitransmitting-reflective film. In such a case, the light emitted from the light emitting layer is resonated between the first interface and the third interface. Or, where the resistance layer has a multilayer structure, the light emitted from the light emitting layer is resonated between the first interface and the fourth interface, or the light emitted from the light emitting layer is resonated between the first interface and the third interface and between the first interface and the fourth interface.

Further, in the light emitting elements according to the present embodiment including the above-described preferred configurations or forms, a configuration may be adopted in which the light emitted from the light emitting layer is resonated between the first interface and the second interface (or the above-mentioned third interface or fourth interface), and part of the resonated light is emitted from the second electrode. In this case, let the optical distance from the first interface to a maximum luminescence position of the light emitting layer be $OL_1$, and let the optical distance from the second interface (or the third or fourth interface) to the maximum luminescence position of the light emitting layer be $OL_2$, then a form can be adopted in which the following expressions (1-1) and (1-2) are satisfied. Alternatively, in this case, let the optical distance between the first interface and the second interface (or the third or fourth interface) be OL, let the sum of phase shifts generated when the light emitted from the light emitting layer is reflected at the first interface and at the second interface (or the third or fourth interface) be $\Phi$ radians [provided that $-2\pi < \Phi \leq 0$], and let a maximum-peak wavelength in the spectrum of the light emitted from the light emitting layer be $\lambda$, then a form can be adopted in which the relation of $$0.7 \leq \{(2 \times OL)/\lambda + \Phi/(2\pi)\} \leq 1.3$$

or $$-0.3 \leq \{(2 \times OL)/\lambda + \Phi/(2\pi)\} \leq 0.3$$

is satisfied. Where interference conditions or resonance conditions for the light which are constituted of the designs of the organic layer and the first electrode and the semitransmitting-reflective film in the light emitting element are prescribed in this manner, dependences of luminance and chromaticity on viewing angle can be reduced to very low levels.

$$0.7\{-\Phi_1/(2\pi)+m_1\} \leq 2 \times OL_1/\lambda \leq 1.2\{-\Phi_1/(2\pi)+m_1\} \quad (1\text{-}1)$$

$$0.7\{-\Phi_2/(2\pi)+m_2\} \leq 2 \times OL_2/\lambda \leq 1.2\{-\Phi_2/(2\pi)+m_2\} \quad (1\text{-}2)$$

where $\lambda$ is the maximum-peak wavelength in the spectrum of the light generated in the light emitting layer, $\Phi_1$ is the phase shift amount (unit: radian) of reflected light generated at the first interface [provided that $-2\pi < \Phi_1 \leq 0$], and $\Phi_2$ is the phase shift amount (unit: radian) of reflected light generated at the second interface (or the third or fourth interface) [provided that $-2\pi < \Phi_2 \leq 0$], and the values of $(m_1, m_2)$ are $(0, 0)$ or $(1, 0)$ or $(0, 1)$.

Incidentally, it is desirable that the mean light reflectance of the first electrode is not less than 50%, preferably not less than 80%, and the mean light transmittance of the semitransmitting-reflective film is in the range of 50 to 97%, preferably 60 to 97%.

In the light emitting elements according to the present embodiment including the above-described preferred configurations or forms, a form can be adopted in which:

the light emitted from the light emitting layer is resonated between the first interface and the second interface (or the third or fourth interface), and part of the resonated light is emitted from the second electrode;

the maximum-peak wavelength in the spectrum of the light generated in the light emitting layer is in the range of 600 to 650 nm; and the thickness of the organic layer on the upper side of the first electrode is in the range of $1.1 \times 10^{-7}$ to $1.6 \times 10^{-7}$ m (this is a red light emitting element constituting a red light emitting sub-pixel for emitting red light, and is referred to as a red light emitting element or red light emitting organic EL element).

In the light emitting elements according to the present embodiment including the above-described preferred configurations or forms, a form can be adopted in which:

the light emitted from the light emitting layer is resonated between the first interface and the second interface (or the third or fourth interface), and part of the resonated light is emitted from the second electrode;

the maximum-peak wavelength in the spectrum of the light generated in the light emitting layer is in the range of 500 to 550 nm; and the thickness of the organic layer on the upper side of the first electrode is in the range of $9 \times 10^{-8}$ to $1.3 \times 10^{-7}$ m (this is a green light emitting element constituting a green light emitting sub-pixel for emitting green light, and is referred to as a green light emitting element or green light emitting organic EL element).

Or, in the light emitting elements according to the present embodiment including the above-described preferred configurations or forms, a form can be adopted in which:

the light emitted from the light emitting layer is resonated between the first interface and the second interface (or the third or fourth interface), and part of the resonated light is emitted from the second electrode;

the maximum-peak wavelength in the spectrum of the light generated in the light emitting layer is in the range of 430 to 480 nm; and the thickness of the organic layer on the upper side of the first electrode is in the range of $6 \times 10^{-8}$ to $1.1 \times 10^{-7}$ m (this is a blue light emitting element constituting a blue light emitting sub-pixel for emitting blue light, and is referred to as a blue light emitting element or a blue light emitting organic EL element).

Where the organic layer is thus sandwiched between the first electrode and the semitransmitting-reflective film or the resistance layer and has a resonator structure, it is possible to enhance the purity of luminescent color and to enhance luminous efficiency. Moreover, since the mean thickness of the semitransmitting-reflective film on the upper side of the organic layer is 1 to 6 nm, the semitransmitting-reflective film having such an extremely small thickness can generally be present in an at least partly discontinuous state. Therefore, a condition where the first electrode and the semitransmitting-reflective film as a whole are in contact with each other is obviated. In addition, as for the characteristics of the light emitting element, the semitransmitting-reflective film is formed, for example, from Mg—Ag or the like which has been used in organic EL elements according to the related art and the second electrode is provided separately from the semitransmitting-reflective film, so that reliability comparable to those of the light emitting elements or organic EL elements according to the related art can be obtained.

An organic electroluminescence display (organic EL display) based on application of the light emitting elements and the like according to the first to fourth embodiment of the present embodiment including the above-described preferred configurations or forms has a plurality of light emitting elements (organic electroluminescence elements, or organic EL elements) each including:

(a) a first electrode;
(b) an insulating layer which has an opening and in which the first electrode is exposed at a bottom portion of the opening;
(c) an organic layer which is provided ranging from above the portion of the first electrode exposed at the bottom portion of the opening to the portion of the insulating layer surrounding the opening and which has a light emitting layer including an organic light emitting material;
(d) a resistor; and
(e) a second electrode, which are stacked sequentially.

Besides, in the organic EL display based on application of the light emitting elements according to the first embodiment of the present embodiment, a conductive resin layer is formed between the resistance layer and the second electrode. In addition, in the organic EL display based on application of the light emitting elements according to the second embodiment, the second electrode includes a conductive resin material. Further, in the organic EL display based on application of the light emitting elements according to the third embodiment, the resistance layer includes a resin material having a high electric resistance (high-resistance resin material). In addition, in the organic EL display based on application of the light emitting elements according to the fourth embodiment, an auxiliary electrode is formed on the upper side of the second electrode, and the auxiliary electrode and the second electrode are electrically connected to each other through a conductive rib.

Incidentally, in these organic EL displays, the arrangement of the plurality of organic EL elements may be a stripe arrangement, a diagonal arrangement, a delta arrangement, or a rectangle arrangement.

Here, in the organic EL display in which the light emitting elements each have the semitransmitting-reflective film, the portion of the semitransmitting-reflective film on the upper side of the insulating layer is at least partly discontinuous. More specifically, the portion of the semitransmitting-reflective layer on the upper side of the insulating layer may or may not be partly connected with the portion of the semitransmitting-reflective film on the upper side of the organic layer. Or, alternatively, a form may be possible in which in some organic EL elements, the portion of the semitransmitting-reflective film on the upper side of the insulating layer is partly connected with the portion of the semitransmitting-reflective film on the upper side on the organic layer, whereas in the other organic EL elements, the portion of the semitransmitting-reflective film on the upper side of the insulating layer is not connected with the portion of the semitransmitting-reflective film on the upper side of the organic layer.

In the light emitting elements according to the present embodiment, or in the organic EL display based on application of the light emitting elements according to the embodiment, including the above-described various preferred configurations or forms, in the case where the light emitting elements each have the semitransmitting-reflective film and where a foreign matter (particle) or a projected part is present on the first electrode, a configuration may be adopted in which the semitransmitting-reflective film is not formed in the vicinity of the foreign matter or projected part, and the resistance layer is present between the semitransmitting-reflective film located in the periphery of the foreign matter or projected part and the portion of the first electrode located beneath the foreign matter or at the base of the projected part. Here, the foreign matter often is highly possibly adhered onto the first electrode at the time of forming the first electrode or the like or during transportation. On the other hand, the projected part often is generated at the time of forming the first electrode or the like.

Examples of the material (light-reflective material) constituting the first electrode (light-reflective electrode) in the light emitting elements according to the present embodiment, in the case where the first electrode is made to function as anode, include metals having a high work function such as platinum (Pt), gold (Au), silver (Ag), chromium (Cr), tungsten (W), nickel (Ni), copper (Cu), iron (Fe), cobalt (Co), tantalum (Ta), etc. or alloys having a high work function (for example, Ag—Pd—Cu alloys having silver as a main constituent and containing 0.3 to 1 wt % of palladium (Pd) and 0.3 to 1 wt % of copper (Cu) and Al—Nd alloys). Further, where a conductive material having a low work function and a high light reflectance such as aluminum (Al) and aluminum-containing alloys is used, the first electrode formed of the material can be used as anode by enhancing positive hole injection performance by, for example, providing an appropriate hole injection layer. The thickness of the first electrode may be, for example, in the range of 0.1 to 1 μm. Or, alternatively, a structure may be adopted in which a layer of a transparent conductive material having an excellent hole injection characteristic such as indium tin oxide (ITO) and indium zinc oxide (IZO) is stacked on a dielectric multilayer film or a light-reflective film having a high light-reflective property such as aluminum (Al). On the other hand, in the case where the first electrode is made to function as cathode, it is desirable to form the first electrode from a conductive material which has a low work function and a high light reflectance. Or, the conductive material with a high light reflectance used as the anode can be used as cathode by enhancing electron injection performance by, for example, providing an appropriate electron injection layer.

On the other hand, as the material (semi-light-transmitting material) constituting the second electrode in the light emitting elements according to the first, third and fourth embodiments, in the case where the second electrode is made to function as cathode, it is desirable to use a conductive material which permits the emitted light to be transmitted therethrough and which has such a low work function that electrons can be efficiently injected into the organic layer. Thus, examples of the material of the second electrode include such metals and alloys as magnesium-silver alloy, aluminum, silver, calcium, strontium, etc. Besides, a configuration may be adopted in which a so-called transparent electrode material composed of ITO or IZO is accompanied by an appropriate electron injection layer to thereby enhance electron injection performance. The thickness of the second electrode may be in the range of, for example, $2\times10^{-9}$ to $5\times10^{-8}$ m, preferably $3\times10^{-9}$ to $2\times10^{-8}$ m, more preferably $5\times10^{-9}$ to $1\times10^{-8}$ m. In addition, the second electrode may be accompanied by a bus electrode formed of a low-resistance material so as to lower the resistance of the second electrode as a whole. In the case where the second electrode is made to function as anode, it is desirable to form the second electrode from a conductive material which permits the emitted light to be transmitted therethrough and which has a high work function.

Examples of the materials for constituting the auxiliary electrode and the bus electrode include aluminum, aluminum alloys, silver, silver alloys, copper, copper alloys, gold, and gold alloys.

Examples of the method for forming the first electrode, the auxiliary electrode, the bus electrode, and the semitransmitting-reflective film and the method for forming the second electrode in the light emitting elements according to the first, third and fourth embodiments include combinations of vapor deposition methods inclusive of electron beam evaporation method, hot filament evaporation method, vacuum evaporation method, sputtering method, chemical vapor deposition (CVD) method, and ion plating method with etching method; various printing methods such as screen printing method, ink jet printing method, metal mask printing method, etc.; plating methods (electroplating method and electroless plating method); lift-off method; laser ablation method; and sol-gel method. According to the various printing methods or plating methods, it is possible to directly form the first electrode, the second electrode, the auxiliary electrode, the bus electrode, and the semitransmitting-reflective film which have predetermined shapes (patterns). Incidentally, in the case where the semitransmitting-reflective film is formed after formation of the organic layer, it is particularly preferable to form the film based on a film forming method in which the energy of film-forming particles is low, such as the vacuum evaporation method, from the viewpoints of preventing generation of damages to the organic layer and providing discontinuous parts. If damages to the organic layer are generated, non-luminescent pixels (or non-luminescent sub-pixels) called "dark spots" may be formed due to generation of leakage current. It is preferable to carry out the steps ranging from the formation of the organic layer to the formation of the electrodes and the like without exposure to the atmospheric air, from the viewpoint of preventing the organic layer from being deteriorated by moisture in the air. In the case of providing the semitransmitting-reflective film, the second electrode and the semitransmitting-reflective film may or may not be electrically connected to each other.

In the light emitting elements according to the first, second or fourth embodiment, it is preferable that the resistance layer, the first resistance layer, the second resistance layer, and the third resistance layer are formed by a film forming method which ensures good coverage, such as sputtering method, CVD method, ion plating method, etc.

The first electrode and the semitransmitting-reflective film each absorb part of the incident light and reflect the rest of the incident light. Therefore, phase shifts are generated in the reflected light. The phase shift amounts $\Phi_1$ and $\Phi_2$ can be determined by measuring the values of the real part and the imaginary part of each of the complex refractive indexes of the materials constituting the first electrode and the semitransmitting-reflective film by, for example, an ellipsometer and performing computations based on the measured values (refer to, for example, "Principles of Optic," Max Born and Emil Wolf, 1974 (PERGAMON PRESS)). Incidentally, the refractive indexes of the organic layer, the second electrode, and other layers can also be determined by measurement using an ellipsometer.

The organic layer has the light emitting layer including an organic light emitting material. Specifically, for example, the organic layer may have a stacked structure of a hole transport layer and a light emitting layer and an electron transport layer, a stacked structure of a hole transport layer and a light emitting layer functioning also as an electron transport layer, a stacked structure of a hole injection layer and a hole transport layer and a light emitting layer and an electron transport layer and an electron injection layer, or the like. Besides, the organic layer may have a two-stage tandem structure in which two of such stacked structures (referred to as "tandem units," for convenience) are stacked over each other with a joint layer therebetween. Further, the organic layer may have a three- or more-stage tandem structure in which three or more tandem units are stacked. In these cases, the luminescent colors may be changed to be red, green, and blue on a tandem unit basis, whereby it is possible to obtain an organic layer which emits white light as a whole. Examples of the method for forming the organic layer include physical vapor deposition (PVD) methods such as vacuum evaporation method; printing methods such as screen printing method, ink jet printing method, etc.; laser transfer methods such as a method in which a stacked structure of an organic layer and a laser absorbing layer formed on a transfer substrate is irradiated with laser light to separate the organic layer on the laser absorbing layer, thereby transferring the organic layer; and various coating methods. In the case of forming the organic layer by a vacuum evaporation method, for example, the organic layer can be obtained by using a so-called metal mask and depositing a material having passed through an opening or openings provided in the metal mask.

Here, in the light emitting elements according to the present embodiment, it is desirable that the thickness of the hole transport layer (hole supply layer) and the thickness of the electron transport layer (electron supply layer) are approximately equal. Alternatively, the hole transport layer (hole supply layer) may be formed to be thicker than the electron transport layer (electron supply layer); in this case, supply of electrons to the light emitting layer necessary and sufficient for enhancing efficiency can be performed at a low driving voltage. Specifically, in the light emitting elements according to the present embodiment, a configuration may be adopted in which the hole transport layer is disposed between an electrode corresponding to anode and the light emitting layer, and the hole transport layer is formed to be thinner than the electron transport layer, whereby the supply of holes is augmented. As a result, such a carrier balance that holes and electrons are just enough and that the amount of the carriers supplied is sufficiently large can be obtained, and, accordingly, a high luminous efficiency can be obtained. In addition, with the holes and electrons are just enough, the carrier balance is unlikely to be collapsed, deterioration of driving is restrained, and the light emission life can be prolonged.

A plurality of the light emitting elements or organic EL elements are formed on the first substrate or on the upper side of the first substrate. Here, examples of the first substrate, or of the second substrate, include a high-distortion-point glass substrate, a soda glass ($Na_2O.CaO.SiO_2$) substrate, a borosilicate glass ($Na_2O.B_2O_3.SiO_2$) substrate, forsterite ($2MgO.SiO_2$) substrate, a lead glass ($Na_2O.PbO.SiO_2$) substrate, various glass substrates provided thereon with an insulating film, a quartz substrate, a quarts substrate provided thereon with an insulating film, a silicon substrate provided thereon with an insulating film, and organic polymers (having any of polymer material forms such as flexible plastic films, plastic sheets and plastic substrates formed of polymer material) such as polymethyl methacrylate (PMMA), polyvinyl alcohol (PVA), polyvinyl phenol (PVP), polyether sulfone (PES), polyimides, polycarbonate, and polyethylene terephthalate PET). It is to be noted here, however, that in the case of a bottom emission type organic EL display, the first substrate is required to be transparent to the light emitted by the light emitting elements. The material constituting the first substrate and the material constituting the second substrate may be the same or different.

In the organic EL display, the first electrode is provided, for example, over an interlayer insulating layer. The interlayer insulating layer is covering a light emitting element driving part formed over the first substrate. The light emitting element driving part includes one or a plurality of thin film transistors (TFTs), and the TFT and the first electrode are electrically connected to each other through a contact plug provided in the interlayer insulating layer. Examples of the material constituting the interlayer insulating film include $SiO_2$ materials such as $SiO_2$, BPSG, PSG, BSG, AsSG, PbSG, SiON, SOG (spin-on-glass), low-melting-point glass, glass paste, etc.; SiN materials; insulating resins such as polyimides, etc., which may be used singly or in an appropriate combination thereof. Examples of the method which can be used for forming the interlayer insulating layer include known methods such as CVD methods, coating methods, sputtering methods, various printing methods, etc. In the bottom emission type organic EL display, the interlayer insulating layer is required to be formed from a material which is transparent to the light emitted from the light emitting elements, and the light emitting element driving part is required to be so formed as not to block the light coming from the light emitting element. On the other hand, the insulating layer provided over the interlayer insulating layer, preferably, is excellent in flatness and is formed from an insulating material having a low water absorption for preventing deterioration of the organic layer due to water, thereby maintaining good luminance in light emission. Specific examples of the insulating material include polyimide resins. In the case where the second electrode is provided with a bus electrode formed from a low-resistance material, it is desirable for the bus electrode to be provided at such a position that a projection image of the bus electrode is included in a corresponding projection image of the insulating layer.

In the light emitting elements according to the present embodiment, in the case of fabricating a top emission type organic EL display, a protective film and an adhesive layer (sealing layer) may be formed in this order from the second electrode side, between the second electrode and the second substrate. Here, the material constituting the protective film is preferably a material which is transparent to the light emitted from the light emitting layer, is dense, and is impermeable to water. Specific examples of this material include amorphous silicon ($\alpha$-Si), amorphous silicon carbide ($\alpha$-SiC), amorphous silicon nitride ($\alpha$-$Si_{1-x}N_x$), amorphous silicon oxide ($\alpha$-$Si_{1-y}O_y$), amorphous carbon ($\alpha$-C), amorphous silicon oxynitride ($\alpha$-SiON), and $Al_2O_3$. Examples of the material constituting the adhesive layer (sealing layer) include thermosetting adhesives such as acrylic adhesives, epoxy adhesives, urethane adhesives, silicone adhesives, cyanoacrylate adhesives, etc., and UV-curing adhesives. Incidentally, in the case of fabricating a bottom emission type organic EL display, also, the above-mentioned protective film and adhesive layer may be formed in this order from the first electrode side, between the first electrode and the second substrate.

In some cases, an insulating or conductive protective film may be provided on the upper side of the organic layer, for the purpose of preventing water from reaching the organic layer. It is preferable that the protective film is formed particularly by a film forming method in which the energy of film-forming particles is low, such as vacuum evaporation method, or by a CVD method, since the influences on the underlying layer can be lessened. Or, it is desirable to set the film forming temperature at normal temperature in order to prevent luminance from being lowered due to deterioration of the organic layer. Further, it is desirable to form the protective film under such conditions as to minimize a stress in the protective film, in order to prevent exfoliation of the protective film. In addition, the protective film is preferably formed without exposing already formed electrodes to the atmospheric air, whereby the organic layer can be prevented from being deteriorated due to moisture and oxygen in the air. Furthermore, in the case where the organic EL display is of the top emission type, the protective film is desirably formed from a material through which not less than 80%, for example, of the light generated in the organic layer is transmitted. Specific examples of the material include inorganic amorphous insulating materials, such as the above-mentioned materials. Such an inorganic amorphous insulating material is free of creation of grains, so that it is low in water permeability and forms a good protective film. In the case of forming the protective film from a conductive material, the protective film may be formed from a transparent conductive material such as ITO and IZO.

Where the organic EL display is a color display type organic EL display, the organic EL elements constituting the organic EL display constitute sub-pixels, respectively. Here, one pixel is composed of three kinds of sub-pixels, namely, a red light emitting sub-pixel (including a red light emitting element) for emitting red light, a green light emitting sub-pixel (including a green light emitting element) for emitting green light, and a blue light emitting sub-pixel (including a blue light emitting element) for emitting blue light. Therefore, where the number of the organic EL elements constituting the organic EL display is N×M, the number of the pixels is (N×M)/3. Or, alternatively, the organic EL display can be used as an illumination device inclusive of a backlight device for a liquid crystal display and a surface light source device.

The second substrate or the first substrate through which the light from the light emitting elements is transmitted may be provided, if necessary, with a color filter or a light blocking film (black matrix).

In some cases, the electric resistance $R_R$ of the resistance layer constituting the red light emitting element, the electric resistance $R_G$ of the resistance layer constituting the green light emitting element, and the electric resistance $R_B$ of the resistance layer constituting the blue light emitting element may be different from one another. Specifically, for example, the relations:

$R_B > R_G$ $R_B > R_R$ may be satisfied. In order that $R_B$, $R_G$, and $R_R$ are different, for example, it suffices to make different the thickness of the resistance layer constituting the red light emitting element, the thickness of the resistance layer constituting the green light emitting element, and the thickness of the resistance layer constituting the blue light emitting element. Alternatively, it suffices to ensure that the material forming the resistance layer constituting the red light emitting element, the material forming the resistance layer constituting the green light emitting element, and the material forming the resistance layer constituting the blue light emitting element are different from one another. Or, it suffices to set different the content of a substance contributing to electrical conductivity in the resistance layer constituting the red light emitting element, the content of a substance contributing to electrical conductivity in the resistance layer constituting the green light emitting element, and the content of a substance contributing to electrical conductivity in the resistance layer constituting the blue light emitting element.

Besides, in some cases, a lead-out electrode for connecting the second electrode to an external circuit may be provided in a peripheral region of the organic EL display. Here, the peripheral region of the organic EL display is a region which surrounds a display region in the manner of a picture frame, and the display region is that substantially centrally located region of the organic EL display which functions to display images in practical use. The lead-out electrode is provided on the first substrate or the second substrate, and may include a so-called high-melting-point metal film such as a titanium (Ti) film, a molybdenum (Mo) film, a tungsten (W) film, a tantalum (Ta) film, etc. For connection between the second electrode and the lead-out electrode, for example, it suffices to form an extension part of the second electrode on the lead-out electrode. Examples of the method for forming the lead-out electrode include the same methods as the above-described methods for forming the first electrode and the second electrode.

EXAMPLE 1

Example 1 relates to the light emitting element according to the first embodiment and the method of manufacturing the light emitting element according to the first embodiment. FIG. 1 shows a schematic partial sectional view of an organic EL display based on application of the light emitting elements according to the first embodiment, and FIGS. 2A and 2B each show a schematic partial sectional view of the organic layer and the like in the light emitting element in Example 1. The organic EL display in Example 1 is an active matrix type organic EL display for color display, and of the top emission type. In other words, light is emitted out through the second electrode and, further, through the second substrate.

The organic EL display in Example 1 or in Examples 2 to 9 described later has a plurality (e.g., N×M=2880×540) of light emitting elements (specifically, organic EL elements) 10A. Incidentally, one light emitting element (organic EL element) 10A constitutes one sub-pixel. Therefore, the organic EL display has (N×M)/3 pixels. Here, one pixel is composed of three kinds of sub-pixels, namely, a red light emitting sub-pixel (including a red light emitting element) for emitting red light, a green light emitting sub-pixel (including a green light emitting element) for emitting green light, and a blue light emitting sub-pixel (including a blue light emitting element) for emitting blue light.

As shown in FIG. 1 and in FIGS. 2A and 2B, the light emitting element (organic EL element) in Example 1 or in Examples 2 to 9 described later includes:
  (A) a first electrode 21;
  (B) an organic layer 23 having a light emitting layer 23A including an organic light emitting material;
  (C) a resistance layer; and
  (D) a second electrode,
which are stacked sequentially.

In addition, the organic EL display in Example 1 or in Examples 2 to 9 described later has a plurality of light emitting elements (organic electroluminescence elements; organic EL elements) each of which includes:
  (a) a first electrode 21;
  (b) an insulating layer 24 which has an opening 25 and in which the first electrode 21 is exposed at a bottom portion of the opening 25;
  (c) an organic layer 23 which is provided over an range from above the portion of the first electrode 21 exposed at the bottom portion of the opening 25 to the portion of the insulating layer 24 surrounding the opening 25 and which has a light emitting layer 23A including an organic light emitting material;
  (d) a resistance layer; and
  (e) a second electrode,
which are stacked sequentially.

In Example 1 and in Examples 2 to 9 described later, the first electrode 21 is formed on the upper side of a first substrate 11, is used as anode, and includes a light-reflective material such as an Al—Nd alloy having a thickness of 0.2 μm. The first electrode 21 is patterned in a predetermined shape, and is formed based on a combination of a vacuum evaporation method and an etching technique. The second electrode is formed on a surface, facing the first substrate 11, of a second substrate 31 and is used as cathode.

In the light emitting element (organic EL element) or the organic EL display in Example 1, a conductive resin layer 60 is formed between a resistance layer 50A and the second electrode 22A. Here, the conductive resin layer 60 has an electric resistivity of $1 \times 10^{-4}$ to $1 \times 10^{2}$ Ω·m ($1 \times 10^{-2}$ to $1 \times 10^{4}$ Ω·cm), a specific example being $3.5 \times 10^{-3}$ Ω·m, and has a thickness of $1 \times 10^{-6}$ to $1 \times 10^{-4}$ m, a specific example being 10 μm. The conductive resin layer 60 includes a copolymer obtained by copolymerization of an acrylic polymer with a pyrrole-based conductive polymer in weight ratio in the range from 1:2 to 1:3. The material constituting the resistance layer 50A has an electric resistivity of $1 \times 10^{2}$ to $1 \times 10^{6}$ Ω·m ($1 \times 10^{4}$ to $1 \times 10^{8}$ Ω·cm), a specific example being $1 \times 10^{4}$ Ω·m ($1 \times 10^{6}$ Ω·cm); specifically, the resistance layer 50A is composed of a layer of niobium oxide ($Nb_2O_5$) having a thickness of 0.5 μm. The second electrode 22A is formed of a transparent conductive material such as ITO and IZO, and has a thickness of 0.1 μm. Besides, the second electrode 22A is formed over the second substrate 31, based on a lift-off method including a sputtering method.

Further, in the light emitting element in Example 1 or in Examples 2 to 9 described later, a semitransmitting-reflective film 40 having a mean thickness of 1 to 6 nm is formed between the resistance layer 50A and the organic layer 23. The first electrode 21 reflects the light coming from the light emitting layer 23A, and the second electrode 22A transmits the light having been transmitted through the semitransmitting-reflective film 40. Here, the semitransmitting-reflective film 40 is composed of an alkali metal or alkaline earth metal and silver (Ag). More specifically, the semitransmitting-reflective film 40 is composed of Mg—Ag in a thickness of 5 nm. The volume ratio of magnesium and silver is Mg:Ag=10: 1. The semitransmitting-reflective film 40 is formed particularly by a film forming method in which the energy of film-forming particles is low, such as a vacuum evaporation method. The second electrode 22A and the semitransmitting-reflective film 40 are each formed in a sheet-like shape, without being patterned.

The portion 40A of the semitransmitting-reflective film 40 on the upper side of the insulating layer 24 is at least partly discontinuous. However, the portion 40A of the semitransmitting-reflective film 40 on the upper side of the insulating layer 24 is partly connected with the portion 40B of the semitransmitting-reflective film 40 on the upper side of the organic layer 23. In some cases, the portion 40A of the semitransmitting-reflective film 40 on the upper side of the insulating layer 24 is not connected with the portion 40B of the semitransmitting-reflective film 40 on the upper side of the organic layer 23. Or, in some cases, a configuration may be adopted in which, in some of the organic EL elements, the portion 40A of the semitransmitting-reflective film 40 on the upper side of the insulating layer 24 is partly connected with the portion 40B of the semitransmitting-reflective film 40 on the upper side of the organic layer 23, whereas, in the remainder of the organic EL elements, the portion 40A of the semitransmitting-reflective film 40 on the upper side of the insulating layer 24 is not connected with the portion 40B of the semitransmitting-reflective film 40 on the upper side of the organic layer 23. Incidentally, the mean thickness of the portion 40A of the semitransmitting-reflective film 40 on the upper side of the insulating layer 23 is smaller than the mean thickness of the portion 40B of the semitransmitting-reflective film 40 on the upper side of the organic layer 23. Therefore, by setting the mean thickness of the portion 40B of the semitransmitting-reflective film 40 on the upper side of the organic layer 23 to within the range of 1 to 6 nm, the portion 40A of the semitransmitting-reflective film 40 on the upper side of the insulating layer 24 can securely be made discontinuous.

An electron injection layer (not shown) composed of LiF in a thickness of 0.3 nm is formed between the organic layer 23 and the semitransmitting-reflective film 40.

In Example 1 or in Examples 2 to 9 described later, the insulating layer 24 is excellent in flatness, and is formed from an insulating material having a low water absorption for preventing deterioration of the organic layer 23 due to water and for maintaining good luminance in light emission, a specific example of the insulating material being a polyimide resin. The organic layer 23 has, for example, a stacked structure in which a hole injection layer (not shown), a hole transport layer 23B, a light emitting layer 23A and an electron transport layer 23C are stacked in this order from the first electrode 21 side. However, the organic layer 23 may in some cases be represented as a single layer in the drawings.

In Example 1 or in Examples 2 to 9 described later, the first electrode 21 constituting the organic EL element is provided over an interlayer insulating layer 16 (more specifically, an upper interlayer insulating layer 16B) formed from $SiO_2$ by a CVD method. The interlayer insulating layer 16 is covering organic EL element driving parts formed over the first substrate 11 which is formed from soda glass. The organic EL element driving part includes a plurality of TFTs, and the TFT and the first electrode 21 are electrically interconnected through a contact plug 18 provided in the interlayer insulating layer 16 (more specifically, the upper interlayer insulating layer 16B), a wiring 17, and a contact plug 17A. Incidentally, in the drawings, one TFT is shown per one organic EL element driving part. The TFT includes: a gate electrode 12 formed over the first substrate 11; a gate insulating film 13 formed over the first substrate 11 and the gate electrode 12; source/drain regions 14 provided in a semiconductor layer formed over the gate insulating film 13; and a channel forming region 15 corresponding to that portion of the semiconductor layer which is between the source/drain regions 14 and which is located on the upper side of the gate electrode 12. While the TFT is of the bottom gate type in the example shown in the drawings, the TFT may be of the top gate type. The gate electrode 12 of the TFT is connected to a scanning circuit (not shown).

Summing up the foregoing, detailed configuration of the light emitting element in Example 1 is as set forth in Table 1 below. Besides, measurement results of refractive indexes of the first electrode 21 and the second electrode 22A, measurement results of light reflectances of the first electrode 21 and the second electrode 22A, and measurement results of light transmittance of the semitransmitting-reflective film 40 are shown in Table 2 below. The measurements were carried out at a wavelength of 530 nm.

TABLE 1

| | |
|---|---|
| Second substrate 31 | Soda glass |
| Second electrode (Cathode) 22A | ITO layer (0.1 μm thick) |
| Conductive resin layer 60 | As above-mentioned (10 μm thick) |
| Resistance layer 50A | $Nb_2O_5$ layer (0.5 μm thick) |
| Semitransmitting-reflective film 40 | Mg—Ag film (5 nm thick) |
| Electron injection layer | LiF layer (0.3 nm thick) |
| Organic layer 23 | Described later |
| First electrode (Anode) 21 | Al—Nd layer (0.2 μm thick) |
| Interlayer insulating layer 16 | $SiO_2$ layer |
| TFT | Constituting an organic EL element driving part |
| First substrate 11 | Soda glass |

TABLE 2

Refractive index of first electrode 21
  Real part: 0.755
  Imaginary part: 5.466
Refractive index of semitransmitting-reflective film 40
  Real part: 0.617
  Imaginary part: 3.904
Refractive index of second electrode 22A
  Real part: 1.814
  Imaginary part: 0
Refractive index of resistance layer 50A
  Real part: 2.285
  Imaginary part: 0
Refractive index of conductive resin layer 60
  Real part: 1.55
  Imaginary part: 0
Light reflectance of first electrode 21: 85%
Light transmittance of semitransmitting-reflective film 40: 79%
Light reflectance of second electrode 22A: 2%

The light emitted from the light emitting layer 23A is resonated between a first interface 26, which is composed of an interface between the first electrode 21 and the organic layer 23, and a second interface 27, which is composed of an interface between the semitransmitting-reflective film 40 and the organic layer 23, and part of the resonated light is emitted out through the semitransmitting-reflective film 40 and, further, through the second electrode 22A.

Figure 2A:
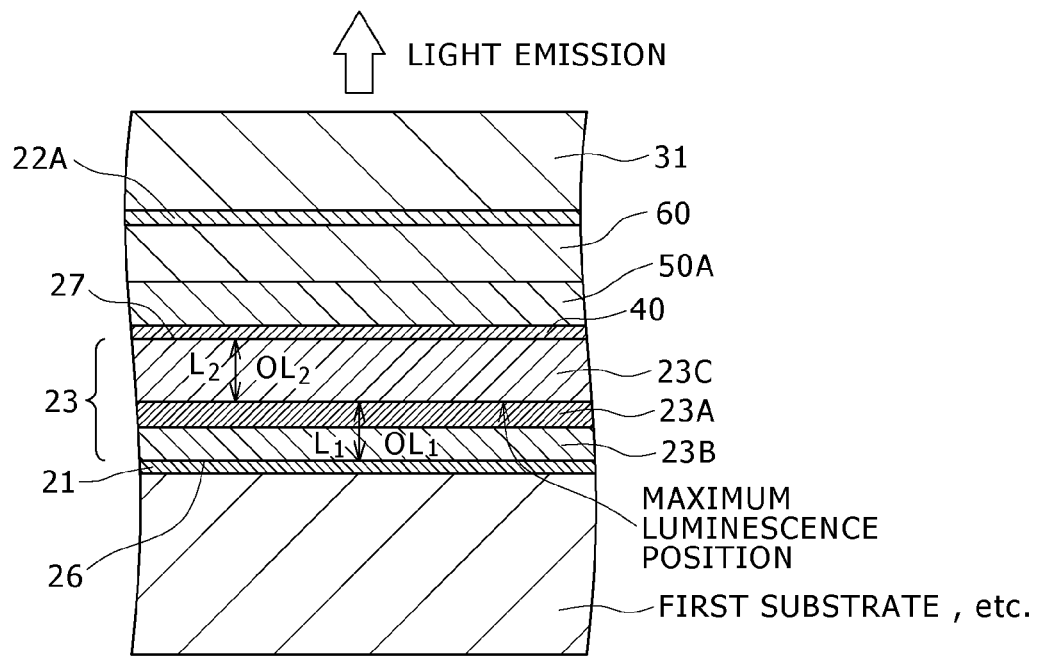
FIGS. 2A and 2B are each a schematic partial sectional view of a light emitting element in Example 1.
Figure 2B:
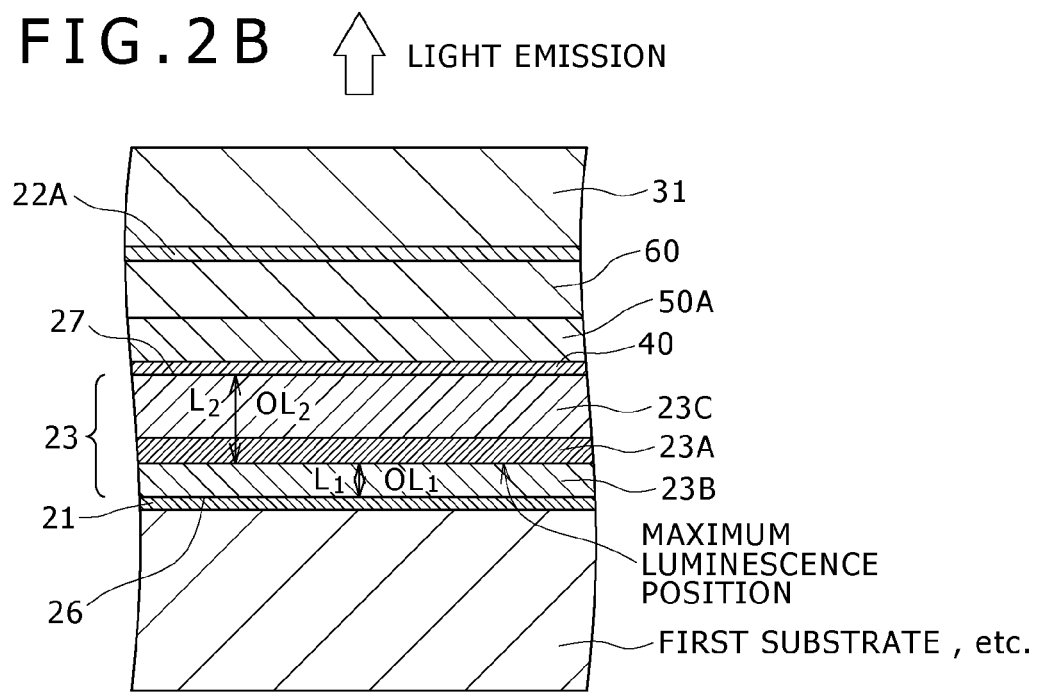

Besides, in the light emitting element in Example 1, let the distance from the first interface 26 to the maximum luminescence position in the light emitting layer 23A be $L_1$, let the relevant optical distance be $OL_1$, let the distance from the second interface 27 to the maximum luminescence position in the light emitting layer 23A be $L_2$, and let the relevant optical distance be $OL_2$, as shown in FIGS. 2A and 2B, the relations represented by the following expressions (1-1) and (1-2) are satisfied.

$$0.7\{-\Phi_1/(2\pi)+m_1\} \le 2 \times OL_1/\lambda \le 1.2\{-\Phi_1/(2\pi)+m_1\} \quad (1\text{-}1)$$

$$0.7\{-\Phi_2/(2\pi)+m_2\} \le 2 \times OL_2/\lambda \le 1.2\{-\Phi_2/(2\pi)+m_2\} \quad (1\text{-}2)$$

where $\lambda$ is the maximum-peak wavelength in the spectrum of the light generated in the light emitting layer 23A, $\Phi_1$ is the phase shift amount (unit: radian) of reflected light generated at the first interface 26 [provided that $-2\pi < \Phi_1 \le 0$], and $\Phi_2$ is the phase shift amount (unit: radian) of reflected light generated at the second interface 27 [provided that $-2\pi < \Phi_2 \le 0$], and the values of $(m_1, m_2)$ are (0, 0) in Example 1 or in Examples 2 to 9 described later.

Further, in Example 1 or in Examples 2 to 9 described later, let the optical distance between the first interface 26 and the second interface 27 be $OL$, let the sum of phase shifts generated upon reflection of the light generated in the light emitting layer 23A on the first interface 26 and on the second interface 27 be $\Phi$ radian [provided that $-2\pi < \Phi \le 0$], and let the maximum-peak wavelength in the spectrum of the light generated in the light emitting layer 23A be $\lambda$, then the relation of $$-0.3 \le \{(2 \times OL)/\lambda + \Phi/(2\pi)\} \le 0.3$$

is satisfied.

In Example 1 or in Examples 2 to 9 described later, each organic layer 23 is specifically composed of a red light emitting organic layer constituting a red light emitting element, a green light emitting organic layer constituting a green light emitting element, and a blue light emitting organic layer constituting a blue light emitting element. The arrangement of the plurality of the organic EL elements may be a stripe arrangement, a diagonal arrangement, a delta arrangement, or a rectangle arrangement.

Specifically, the red light emitting element (red light emitting organic EL element) has a configuration in which the light emitted from the light emitting layer 23A is resonated between the first interface 26 and the second interface 27, and part of the resonated light is emitted out through the semitransmitting-reflective film 40 and, further, through the second electrode 22A. In addition, the maximum-peak wavelength in the spectrum of the light generated in the light emitting layer 23A is 600 to 650 nm (in Example 1 or in Examples 2 to 9 described later, specifically, 620 nm), and the thickness of the organic layer 23 on the upper side of the first electrode 21 is $1 \times 10^{-7}$ to $1.6 \times 10^{-7}$ m (in Example 1 or in Examples 2 to 9 described later, specifically, 140 nm).

To be more specific, the red light emitting organic layer is configured as shown in Table 3 below. The maximum luminescence position is located at the interface between the electron transport layer 23C and the light emitting layer 23A (see FIG. 2A). Incidentally, in Table 3 or in each of Tables 4 and 5 set forth later, the lower the row in which a layer is set forth in the table is, the closer to the first electrode the layer is located.

TABLE 3

| | Material | Thickness |
|---|---|---|
| Electron transport layer | ET085 (Idemitsu Kosan Co., Ltd.) | 60 nm |
| Light emitting layer | RH001 (Idemitsu Kosan Co., Ltd.) + D125 (0.5% doped) (TORAY INDUSTRIES, INC.) | 50 nm |
| Holes transport layer | HT320 (Idemitsu Kosan Co., Ltd.) | 20 nm |
| Holes injection layer | LGHIL (LG Chemical Ltd.) | 10 nm |

In addition, the green light emitting element (green light emitting organic EL element) has a configuration in which the light emitted from the light emitting layer 23A is resonated between the first interface 26 and the second interface 27, and part of the resonated light is emitted out through the second electrode 22A. Besides, the maximum-peak wavelength in the spectrum of the light generated in the light emitting layer 23A is 500 to 550 nm (in Example 1 and in Examples 2 to 9 described later, specifically, 530 nm), and the thickness of the organic layer 23 on the upper side of the first electrode 21 is $9 \times 10^{-8}$ to $1.3 \times 10^{-7}$ m (in Example 1 or in Examples 2 to 9 described later, specifically, 118 nm).

To be more specific, the green light emitting organic layer is configured as set forth in Table 4 below. Incidentally, the maximum luminescence position is located at the interface between the hole transport layer 23B and the light emitting layer 23A (see FIG. 2B).

TABLE 4

| | Material | Thickness |
|---|---|---|
| Electron transport layer | ETS085 (Idemitsu Kosan Co., Ltd.) | 30 nm |
| Light emitting layer | BH232 (Idemitsu Kosan Co., Ltd.) + GD206 (10% doped) (Idemitsu Kosan Co., Ltd.) | 30 nm |
| Holes transport layer | HT320 (Idemitsu Kosan Co., Ltd.) | 48 nm |
| Holes injection layer | LGHIL (LG Chemical Ltd.) | 10 nm |

Besides, the blue light emitting element (blue light emitting organic EL element) has a configuration in which the light emitted from the light emitting layer 23A is resonated between the first interface 26 and the second interface 27, and part of the resonated light is emitted out through the second electrode 22A. The maximum-peak wavelength in the spectrum of the light generated in the light emitting layer 23A is 430 to 480 nm (in Example 1 and in Examples 2 to 9 described later, specifically, 460 nm), and the thickness of the organic layer 23 on the upper side of the first electrode 21 is $6 \times 10^{-8}$ to $1.1 \times 10^{-7}$ m (in Example 1 or in Examples 2 to 9 described later, specifically, 88 nm).

To be more specific, the blue light emitting organic layer is configured as set forth in Table 5 below. Incidentally, the maximum luminescence position is located at the interface between the hole transport layer 23B and the light emitting layer 23A (see FIG. 2(B)).

TABLE 5

|  | Material | Thickness |
|---|---|---|
| Electron transport layer | ET085 (Idemitsu Kosan Co., Ltd.) | 20 nm |
| Light emitting layer | BH232 (Idemitsu Kosan Co., Ltd.) + BD218 (10% doped) (Idemitsu Kosan Co., Ltd.) | 30 nm |
| Holes transport layer | HT320 (Idemitsu Kosan Co., Ltd.) | 28 nm |
| Holes injection layer | LGHIL (LG Chemical Ltd.) | 10 nm |

The voltage drop across the resistance layer 50A configured as above is as follows. Here, the specifications of the second electrode 22A and the resistance layer 50A are as follows.

[Second electrode 22A]
Electric resistivity ($\rho_1$): $3.0 \times 10^{-4}$ $\Omega \cdot$cm
Thickness ($d_1$): 0.1 μm
Current density ($J_1$) in second electrode 22A: 10 mA/cm²
[Resistance layer 50A]
Electric resistivity ($\rho_2$): $1.0 \times 10^4$ to $1.0 \times 10^6$ $\Omega \cdot$cm
Thickness ($d_2$): 0.5 μm
Current density ($J_2$) in resistance layer 50A: 10 mA/cm²
Sheet resistance of second electrode 22A=$(\rho_1/d_1)$=30Ω/□
Sheet resistance of resistance layer 50A=$(\rho_2/d_2)$=$2 \times 10^8$ to $2 \times 10^{10}$ Ω/□
Voltage drop across second electrode 22A=$\rho_1 \times d_1 \times J_1$=$3.0 \times 10^{-11}$ V
Voltage drop across resistance layer 50A=$\rho_2 \times d_2 \times J_2$=5 to 500 mV As shown above, in the case where the resistance layer 50A is formed of $Nb_2O_5$, the voltage drop across the resistance layer 50A can be estimated at about 0.5 V at maximum, which value does not matter especially, in driving of organic EL elements or an organic EL display.

Examples of the values of λ, $L_1$, $OL_1$, $2OL_1/\lambda$, $L_2$, $OL_2$, $2OL_2/\lambda$, $n_{ave}$, $\{-\Phi_1/(2\pi)+m_1\}$, and $\{-\Phi_2/(2\pi)+m_2\}$ of the red light emitting organic layer, the green light emitting organic layer, and the blue light emitting organic layer are set forth in Table 6 below. Here, $m_1$=0 and $m_2$=0.

TABLE 6

|  | Unit | Red light emitting organic layer | Green light emitting organic layer | Blue light emitting organic layer |
|---|---|---|---|---|
| λ | nm | 620 | 530 | 460 |
| $L_1$ | nm | 80 | 58 | 38 |
| $OL_1$ | nm | 144 | 110 | 75.2 |
| $2OL_1/\lambda$ |  | 0.465 | 0.416 | 0.327 |
| $L_2$ | nm | 60 | 60 | 50 |
| $OL_2$ | nm | 107 | 109 | 93.8 |
| $2OL_2/\lambda$ |  | 0.345 | 0.410 | 0.408 |
| $n_{ave}$ |  | 1.793 | 1.854 | 1.920 |
| $-\Phi_1/(2\pi) + m_1$ |  | 0.399 | 0.380 | 0.357 |
| $-\Phi_2/(2\pi) + m_2$ |  | 0.369 | 0.361 | 0.352 |

Figure 3:
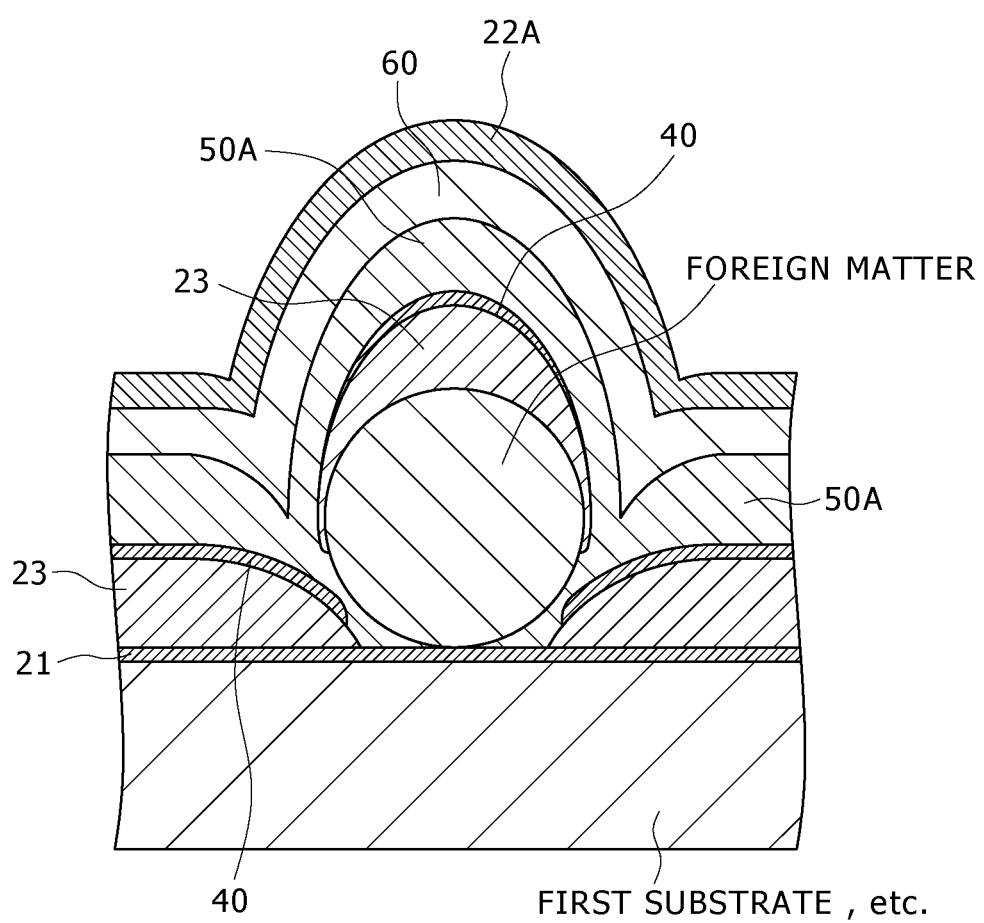
FIG. 3 is a partial sectional view showing schematically the formed states of an organic layer and the like when a foreign matter (particle) is present on a first electrode, in the organic electroluminescence display in Example 1.

Foreign matters (particles) may often be deposited onto the first electrode 21 at the times of forming the first electrode 21 or the like and during transportation. In addition, at the time of forming the first electrode 21, projected parts from the first electrode 21 may often be generated. Further, at the time of forming the organic layer 23, steps may often be generated. Such particles or projected parts result in imperfect coverage of the organic layer 23, as schematically illustrated in FIG. 3. Meanwhile, on the upper side of the organic layer 23, the semitransmitting-reflective film 40 which has a very small thickness of 1 to 6 nm, for example, is formed. Therefore, when a foreign matter or projected part is present on the first electrode 21 or where a step is present there, formation of the semitransmitting-reflective film 40 may be accompanied by generation of a kind of "step discontinuity" in the vicinity of the foreign matter, the projected part or the step. In other words, the semitransmitting-reflective film 40 is not formed in the vicinity of the foreign matter, the projected part or the step. Under this condition, the resistance layer 50A is then formed. Consequently, the resistance layer 50A is present between that portion of the semitransmitting-reflective film 40 which is located in the vicinity of the foreign matter or projected part and that portion of the first electrode 21 which is located beneath the foreign matter or at the base of the projected part.

Figure 4:
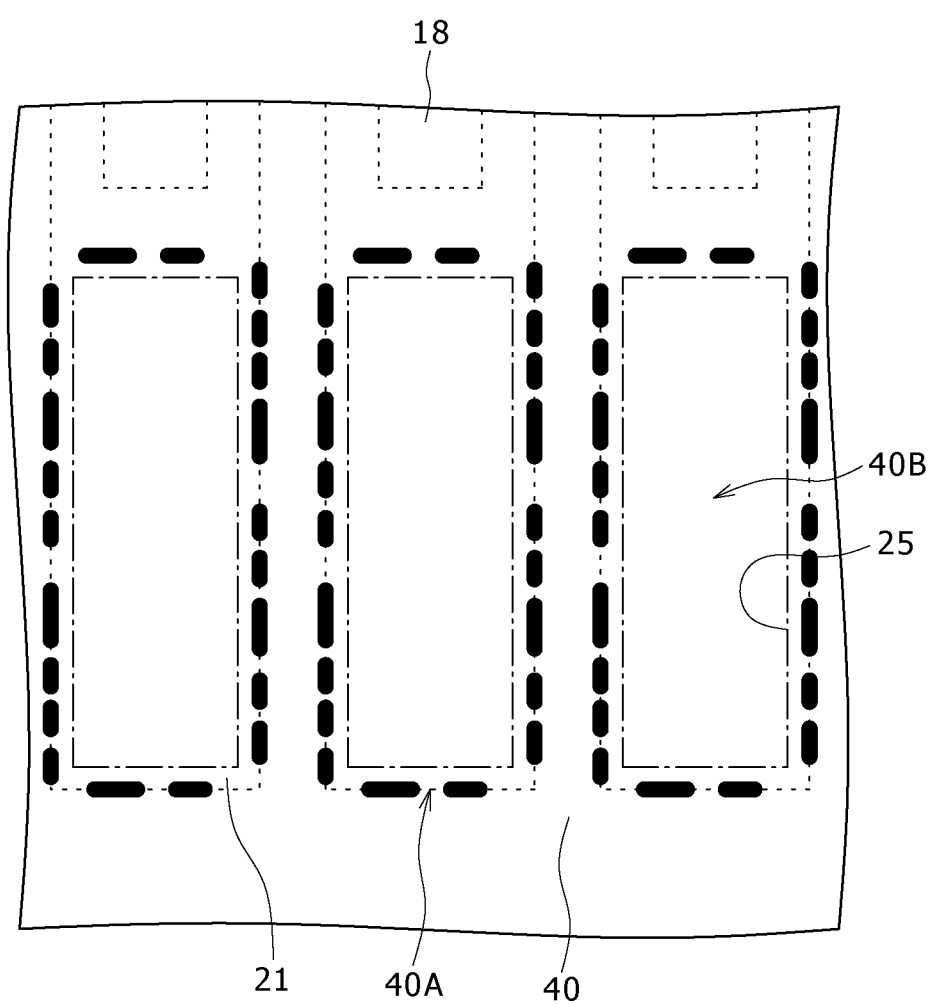
FIG. 4 is a schematic layout view of the organic layer and the like, in the organic electroluminescence display in Example 1.

In addition, as has been described above, the mean thickness of the portion 40B of the semitransmitting-reflective film 40 on the upper side of the organic layer 23 is 1 to 6 nm, so that the portion 40A of the semitransmitting-reflective film 40 on the insulating layer 24 is in a discontinuous state. More specifically, the organic layer 23 having the light emitting layer 23A is provided over the range from above the portion of the first electrode 21 exposed at a bottom portion of the opening 25 to the portion of the insulating layer 24 surrounding the opening 25, and the semitransmitting-reflective film 40 is also provided over the range from above the organic layer 23 to the portion of the insulating layer 24 surrounding the opening 25. Here, the portion of the insulating layer 24 surrounding the opening 25 is slanted down toward the opening 25. Therefore, the thickness of the portion 40A of the semitransmitting-reflective film 40 on the upper side of the portion of the insulating layer 24 surrounding the opening 25 is smaller than the thickness of the portion 40B of the semitransmitting-reflective film 40 on the upper side of the organic layer 23. Accordingly, the portion 40A of the semitransmitting-reflective film 40 on the upper side of the portion of the insulating layer 24 surrounding the opening 25 is in a discontinuous state (an intermittent state). This state is schematically shown in FIG. 4, in which the discontinuous portions of the semitransmitting-reflective film 40 are indicated in solid black. In addition, the contact plugs 18 and the first electrodes 21 are indicated by broken lines, and edge portions of the openings 25 are indicated by dot-dash lines. While the discontinuous portions are shown to be regularly provided in FIG. 4, the discontinuous portions are provided irregularly in practice.

Now, the gist of the method of manufacturing the light emitting element and the organic EL display in Example 1 will be described below, referring to FIGS. 5A to 5C, FIGS. 6A and 6B, and FIGS. 7A and 7B.

[Step 100]

A first substrate 11 provided sequentially with first electrodes 21, an organic layer 23 and a resistance layer 50A is prepared.

[Step 100A]

Specifically, first, TFTs are fabricated on the first substrate 11 on a sub-pixel basis by a known method. The TFT includes a gate electrode 12 formed on the first substrate 11, a gate insulating film 13 formed on the first substrate 11 and the gate electrode 12, source/drain regions 14 formed in a semiconductor layer formed on the gate insulating film 13, and a channel forming region 15 which is between the source/drain regions 14 and which corresponds to the portion of the semiconductor layer located on the upper side of the gate electrode 12. Incidentally, while the TFTs are of the bottom gate type in the example shown in the drawings, the TFTs may be of the top gate type. The gate electrode 12 of the TFT is connected to a scanning circuit (not shown). Next, a lower interlayer insulating layer 16A composed of $SiO_2$ is formed over the first substrate 11 so as to cover the TFTs by a CVD method, and openings 16' are formed in the lower interlayer insulating layer 16A, based on a photolithographic technique and an etching technique (see FIG. 5A).

[Step 100B]

Subsequently, wires 17 of aluminum are formed over the lower interlayer insulating layer 16A, based on a combination of a vacuum evaporation method and an etching method. Incidentally, the wire 17 is electrically connected to the source/drain regions 14 of the TFTs through a contact plug 17A provided in the opening 16'. The wires 17 are connected to a signal supply circuit (not shown). Then, an upper interlayer insulating layer 16B composed of $SiO_2$ is formed over the whole surface by a CVD method. Next, openings 18' are formed on the upper side in the upper interlayer insulating layer 16B, based on a photolithographic technique and an etching technique (see FIG. 5B).

[Step 100C]

Figure 5A:
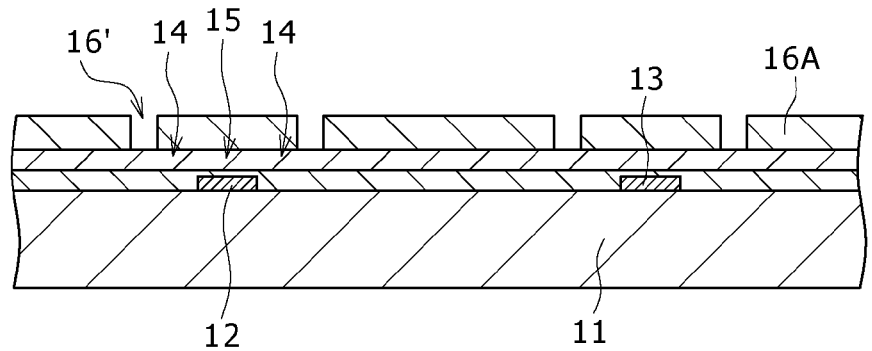
FIGS. 5A, 5B and 5C are schematic partial sectional views of a first substrate and the like for illustrating the gist of a method of manufacturing the light emitting element and the organic electroluminescence display in Example 1.
Figure 5B:
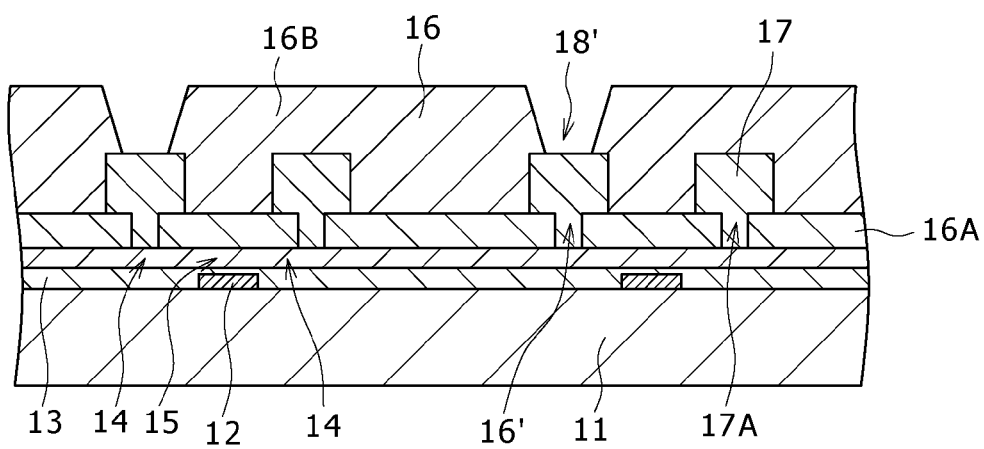
Figure 5C:
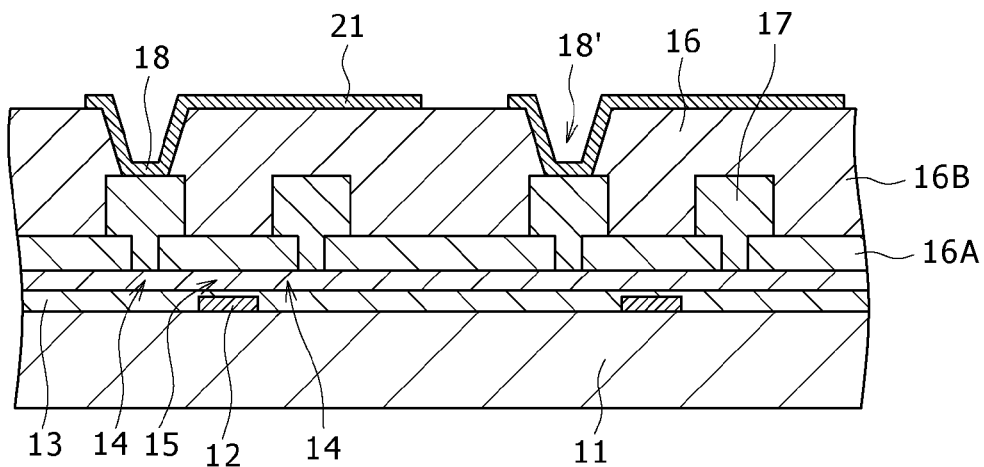

Thereafter, first electrodes 21 composed of an Al—Nd alloy are formed on the upper interlayer insulating layer 16B, based on a combination of a vacuum evaporation method and an etching method (see FIG. 5C). Incidentally, the first electrode 21 is electrically connected to the wire 17 through a contact plug 18 provided in the opening 18'.

[Step 100D]

Figure 6A:
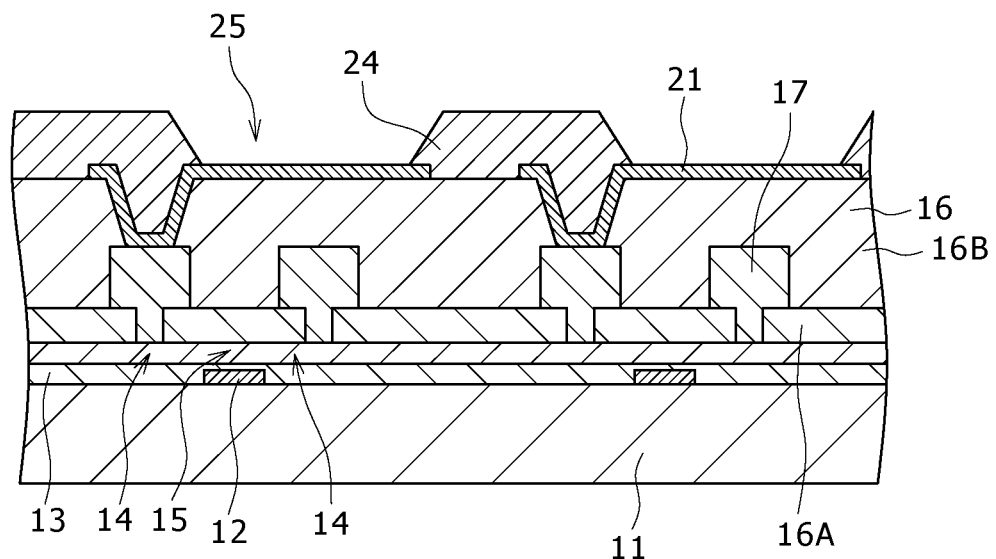
FIGS. 6A and 6B are schematic partial sectional views of the first substrate and the like for illustrating, subsequently to FIG. 5C, the gist of the method of manufacturing the light emitting element and the organic electroluminescence display in Example 1.

Next, an insulating layer 24 which is provided with openings 25 and in which the first electrodes 21 are exposed at bottom portions of the openings 25 is formed over the interlayer insulating layer 16 inclusive of the first electrodes 21 (see FIG. 6A). Specifically, based on a spin coating method and an etching method, the insulating layer 24 composed of a polyimide resin in a thickness of 1 μm is formed on the interlayer insulating layer 16 and on peripheral portions of the first electrodes 21. Incidentally, the portion of the insulating layer 24 surrounding the opening 25 is preferably constituting a gently inclined surface.

[Step 100E]

Figure 6B:
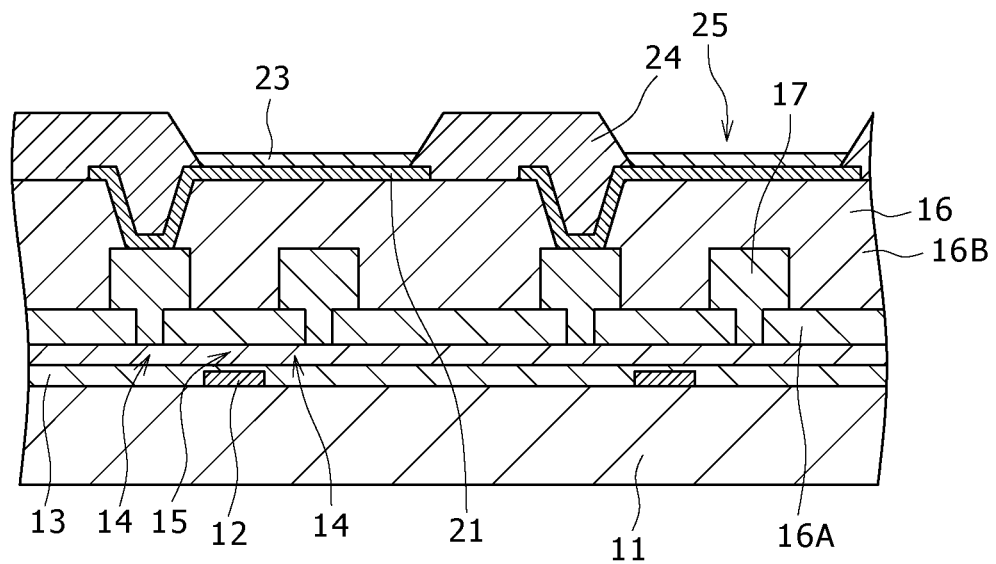

Subsequently, an organic layer 23 is formed over the range from above the portions of the first electrodes 21 exposed at bottom portions of the openings 25 to the portions of the insulating layer 24 surrounding the openings 25 (see FIG. 6B). Incidentally, the organic layer 23 has a configuration in which, for example, a hole transport layer composed of an organic material and a light emitting layer functioning also as an electron transport layer are stacked sequentially. Specifically, with the insulating layer 24 as a kind of spacer, a metal mask (not shown) for forming the organic layer 23 for constituting each sub-pixels on the insulating layer 24 is mounted on projected portions of the insulating layer 24, and, in this condition, an organic material is deposited by vacuum evaporation based on resistance heating. The organic material, by passing through openings provided in the metal mask, is deposited in an area ranging from above the portions of the first electrodes 21 exposed at bottom portions of the openings 25 for constituting sub-pixels to above the portions of the insulating layer 24 surrounding the openings 25.

[Step 100F]

Figure 7A:
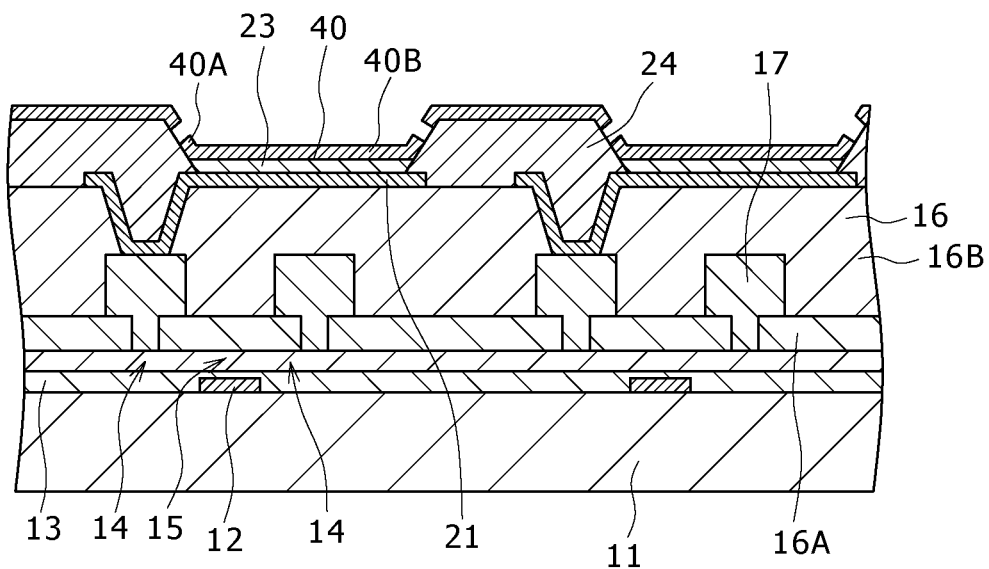
FIGS. 7A and 7B are schematic partial sectional views of the first substrate and the like for illustrating, subsequently to FIG. 6B, the gist of the method of manufacturing the light emitting element and the organic electroluminescence display in Example 1.
Figure 7B:
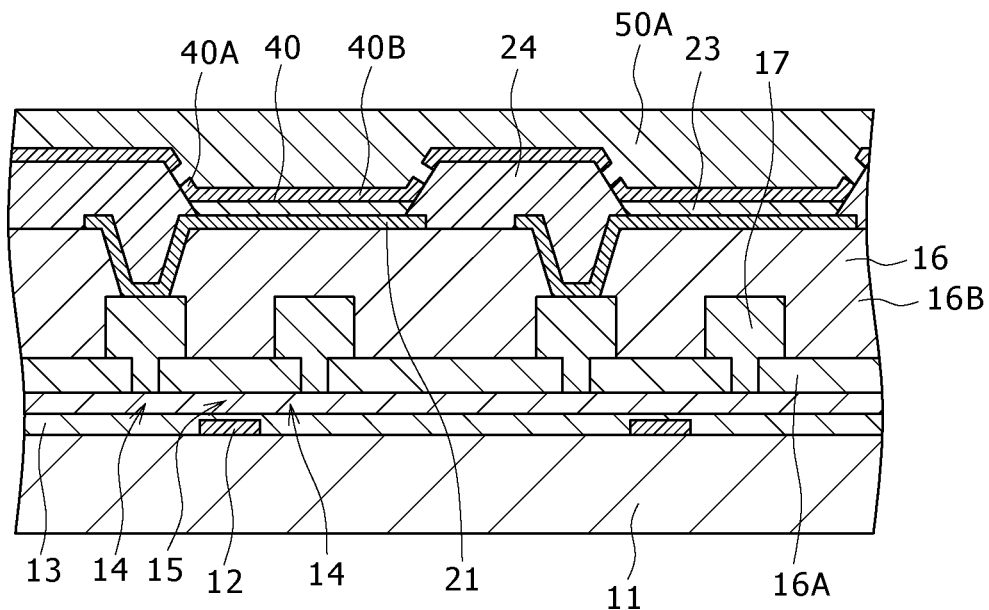

Thereafter, a semitransmitting-reflective film 40 having a mean thickness, on the organic layer 23, of 5 nm is formed over the whole area of a display region (see FIG. 7A). The semitransmitting-reflective film 40 is covering the entire surface of the organic layer 23 for constituting N×M organic EL elements. It should be noted here, however, that the portions 40A of the semitransmitting-reflective film 40 on the insulating layer 24 are at least partly discontinuous, as above-mentioned. The semitransmitting-reflective film 40 is formed based on a vacuum evaporation method, which is a film forming method such that the energy of film-forming particles is so low as not to influence the organic layer 23. Besides, where the formation of the semitransmitting-reflective film 40 is carried out in the same vacuum evaporation system as that for formation of the organic layer 23, without exposing the organic layer 23 to the atmospheric air, it is possible to prevent the organic layer 23 from being deteriorated due to moisture or oxygen in the air. Specifically, by forming a co-evaporated film of Mg—Ag (10:1 in volume ratio), the semitransmitting-reflective film 40 can be obtained. Incidentally, in forming the semitransmitting-reflective film 40, a poorer coverage is more favorable for obtaining a discontinuous state. Accordingly, it is preferable to set the pressure at the time of film formation at a lower value. Specifically, for example, a pressure of $1 \times 10^{-3}$ Pa or below is desirable.

[Step 100G]

Next, a resistance layer 50A which is composed of niobium oxide ($Nb_2O_5$) having an electric resistivity of $1 \times 10^4$ Ω·m ($1 \times 10^6$ Ω·cm) and which has a thickness on the upper side of the organic layer 23 of 0.5 μm is formed by a sputtering method. Though the resistance layer 50A will make contact with a second electrode 22A, if the resistance of the resistance layer 50A can be raised and the current flowing in the resistance layer 50A can be suppressed to or below 1/10 times the current flowing in one sub-pixel as a whole, it is ensured that even upon generation of the condition shown in FIG. 3, it would not be recognized as a defect or fault such as a dark spot or semi-dark spot in the image displayed. In the case where the resistance layer 50A is composed of $Nb_2O_5$, the characteristic required of the resistance layer 50A is calculated as above-mentioned, and its electric resistivity is preferably in the range of $1 \times 10^4$ to $1 \times 10^6$ Ω·m. Besides, taking into account the coverage due to turning-around at the time of forming the resistance layer 50A, a higher pressure at the time of film formation is more favorable, and the pressure is desirably 0.1 to 10 Pa. In addition, in the case where the resistance layer 50A is composed of an oxide semiconductor, the electric resistivity of the resistance layer 50A may vary depending on the oxygen concentration (oxygen partial pressure) at the time of film formation. Where the resistance layer 50A is composed of $Nb_2O_5$, however, even if the oxygen concentration at the time of film formation is varied (specifically, even if the oxygen partial pressure is varied from $1\times10^{-4}$ Pa to $1\times10^{-2}$ Pa, for example), the electric resistivity is varied to $1\times10^2$ to $1\times10^4$ Ω·m ($1\times10^4$ to $1\times10^6$ Ω·cm); thus, a stable electric resistivity can be obtained.

In this manner, the first substrate 11 provided sequentially with the first electrodes 21, the organic layer 23 and the resistance layer 50A can be obtained.

[Step 110]

On the other hand, a second substrate 31 provided with a second electrode 22A is prepared. Specifically, the second electrode 22A, more specifically, an ITO layer having a thickness of 0.1 μm is formed over the whole surface of the display region of the second substrate 31, based on a lift-off method including a sputtering method. Incidentally, in this step, a bus electrode composed of aluminum, for example, may be formed on such a region of the second substrate 31 as not to block the light emitted out through the organic layer 23.

[Step 120]

Then, the resistance layer 50A and the second electrode 22A are adhered to each other through a conductive resin layer 60. Specifically, the conductive resin layer 60 is formed on the resistance layer 50A, based on an ODF system in which a bank is formed in an peripheral area by use of a resin called a sealing agent, and the conductive resin layer 60 is formed on the inside of the bank by a coating method. Then, the conductive resin layer 60 and the second electrode 22A are stacked on each other, and the conductive resin layer 60 is heated, whereby the resistance layer 50A and the second electrode 22A are adhered to each other through the conductive resin layer 60. Or, alternatively, the conductive resin layer 60 is formed on the second electrode 22A by the method similar to the above-mentioned method, the conductive resin layer 60 and the resistance layer 50A are stacked on each other, and the conductive resin layer 60 is heated, whereby the resistance layer 50A and the second electrode 22A are adhered to each other through the conductive resin layer 60. Or, as a further method, an uncured sheet-like conductive resin layer 60 is prepared, then the second electrode 22A and the conductive resin layer 60 and the resistance layer 50A are stacked on one another, and the conductive resin layer 60 is heated, whereby the resistance layer 50A and the second electrode 22A are adhered to each other through the conductive resin layer 60.

[Step 130]

Finally, connection of the thus-obtained assembly to an external circuit is carried out, whereby an organic EL display can be completed.

Incidentally, the semitransmitting-reflective film can also be formed by use of magnesium (Mg)-calcium (Ca), in place of magnesium (Mg)-silver (Ag). Specifically, the volume ratio of magnesium to calcium is Mg:Ca=9:1, and the thickness of the semitransmitting-reflective film is 2 nm. Such a semitransmitting-reflective film can be formed by a vacuum evaporation method.

In the light emitting elements in Example 1, the conductive resin layer 60 is formed between the resistance layer 50A and the second electrode 22A, so that assured conduction can be achieved between the second electrode 22A and the resistance layer 50A. In addition, the formation of the conductive resin layer 60 promises a reduction in the electric resistivity of the second electrode 22A, which is composed of a transparent conductive material such as ITO, and the conductive resin layer 60 as a whole. Besides, in the method of manufacturing the light emitting elements in Example 1, it suffices to preliminarily prepare the second substrate 31 provided with the second electrode 22A. In other words, it is unnecessary to form the second electrode 22A on the upper side of the organic layer 23. This makes it possible not only to prevent the organic layer 23 from being damaged but also to form on the second substrate 31 the second electrode 22A having high quality and excellent properties.

Moreover, in the light emitting elements in Example 1, the organic layer 23 has a resonator structure in which it is sandwiched between the first electrode 21 and the semitransmitting-reflective film 40. In addition, the resistance layer 50A is formed on the upper side of the organic layer 23, and the second electrode 22A is formed on the upper side of the resistance layer 50A. Here, the mean thickness of the semitransmitting-reflective film 40 on the organic layer 23 is 1 to 6 nm. Such an extremely thin semitransmitting-reflective film 40, normally, can be in an at least partly discontinuous state. Therefore, even if a foreign matter (particle) or a projected part is present on the first electrode 21 or a step is present there with the result of imperfect coverage of the organic layer 23, a voltage can be securely impressed on the organic layer 23 through the second electrode 22A. Moreover, the presence of the resistance layer 50A ensures that short circuiting between the first electrode 21 and the second electrode 22D is prevented from occurring, and that the first electrode 21 and the semitransmitting-reflective film 40 are prevented from making contact with each other. In the organic EL display, the portion of the semitransmitting-reflective film 40 located on the upper side of the insulating layer 24 is at least partly discontinuous. Again, therefore, even if a foreign matter or a projected part is present on the first electrode 21 or a step is present there with the result of imperfect coverage of the organic layer 23, a voltage can be assuredly impressed on the organic layer 23 through the second electrode 22A. Moreover, since the resistance layer 50A is present, short circuiting would not occur between the first electrode 21 and the second electrode 22A, and the first electrode 21 and the semitransmitting-reflective film 40 would make contact with each other. Consequently, generation of a defective image or a missing line can be prevented securely. Incidentally, if the first electrode 21 and the semitransmitting-reflective film 40 make contact with each other, the first electrode 21 and the semitransmitting-reflective film 40 are brought to the same potential, so that light emission in the organic layer 23 would not occur. Moreover, since interference conditions or resonance conditions of light constituted by the organic layer 23 and the first electrode 21 and the semitransmitting-reflective film 40 in the light emitting element are specified, the dependences of luminance and chromaticity on viewing angle can be reduced to very low levels.

EXAMPLE 2

Example 2 relates to the light emitting element according to the second embodiment and the method of manufacturing the light emitting element according to the second embodiment. FIGS. 8A and 8B each show schematic partial sectional view of the light emitting element in Example 2.

In Example 1, the conductive resin layer 60 was formed between the second electrode 22A and the resistance layer 50. In Example 2, on the other hand, formation of the conductive resin layer 60 was omitted. Besides, the second electrode 22B was formed from a conductive resin material, specifically, a copolymer obtained by copolymerization of an acrylic polymer and a pyrrole-based conductive polymer in weight ratio in the range from 1:4 to 1:5. Here, the electric resistivity of the conductive resin material is not more than $5\times10^{-3}$ Ω·m (not more than $5\times10^{-1}$ Ω·cm), specifically $1\times10^{-5}$ Ω·m, and the thickness of the second electrode 22B is 1 to 100 μm, specifically 10 μm.

Except for these points, the configurations and structures of the light emitting element and the organic EL display in Example 2 can be the same as the configurations and structures of the light emitting element and the organic EL display in Example 1, so that detailed descriptions of the same points are omitted. Now, the method of manufacturing the light emitting element in Example 2 will be described below.

[Step 200]

First, in the same manner as in [Step 100] (specifically, [Step 100A] to [Step 100G]) of Example 1, a first substrate 11 provided sequentially with first electrodes 21, an organic layer 23 and a resistance layer 50B is prepared.

[Step 210]

Then, the resistance layer 50B and a second substrate 31 are adhered to each other through a second electrode 22B formed from a conductive resin material. Specifically, the second electrode 22B is formed on the resistance layer 50B based on an ODF system in which a bank is formed in a peripheral area by use of a resin called a sealing agent and the second electrode 22B is formed on the inside of the bank by a coating method. Then, the second electrode 22B and the second substrate 31 are stacked on each other, and the conductive resin material constituting the second electrode 22B is heated, whereby the resistance layer 50B and the second substrate 31 are adhered to each other through the second electrode 22B. Or, alternatively, the resistance layer 50B and the second substrate 31 are stacked over each other, with a second electrode 22B composed of a sheet-like material therebetween, and the conductive resin material constituting the second electrode 22B is heated, whereby the resistance layer 50B and the second substrate 31 are adhered to each other through the second electrode 22B. Incidentally, a bus electrode composed of aluminum, for example, may be preliminarily formed on such a region of the second substrate 31 as not to block the light emitted from the organic layer 23. In addition, an electron injection layer formed of LiF may be provided between the second electrode 22B and the resistance layer 50B, so as to enhance electron injection performance.

In the light emitting element in Example 2, the second electrode 22B is formed from a conductive resin material. Therefore, a reduction in the manufacturing cost of the second electrode can be promised, as compared with the second electrode composed of a transparent conductive material such as ITO. Besides, since the resistance layer 50B and the second substrate 31 are adhered to each other through the second electrode 22B formed of the conductive resin material, in other words, since it is unnecessary to form the second electrode on the organic layer 23, the organic layer 23 can be prevented from being damaged.

EXAMPLE 3

Example 3, which is a modification of Example 2, relates to the method of manufacturing the light emitting element according to the 2'-th embodiment. In Example 3, a second electrode was composed of a material obtained by admixing a conductive resin material, specifically a copolymer obtained by copolymerization of an acrylic polymer and a pyrrole-based conductive polymer in a weight ratio in the range from 1:4 to 1:5, with 0.3 wt % of N,N'-methylenebisacrylamide as a crosslinking agent, and gelling the admixture. Here, the electric resistivity of the conductive resin material is specifically $2.4 \times 10^{-5}$ Ω·m, and the thickness of the resistance layer 50C is specifically 10 μm.

Except for these points, the configurations and structures of the light emitting element and the organic EL display in Example 3 can be the same as the configurations and structures of the light emitting element and the organic EL display in Example 2, so that detailed descriptions of the same points are omitted.

In Example 3, a second electrode is preliminarily formed on a second substrate in a step similar to [Step 210] of Example 2. Specifically, the second electrode is formed on the second substrate, based on an ODF system in which a bank is formed in a peripheral area by use of a resin called a sealing agent, and the second electrode is formed on the inside of the bank by a coating method. Then, the second electrode and the resistance layer are stacked on each other, and the conductive resin material constituting the second electrode is heated, whereby the resistance layer and the second substrate are adhered to each other through the second electrode. In Example 3, since the second electrode is preliminarily formed on the second substrate, the range of material selection for the conductive resin material constituting the second electrode is broadened.

EXAMPLE 4

Figure 9A:
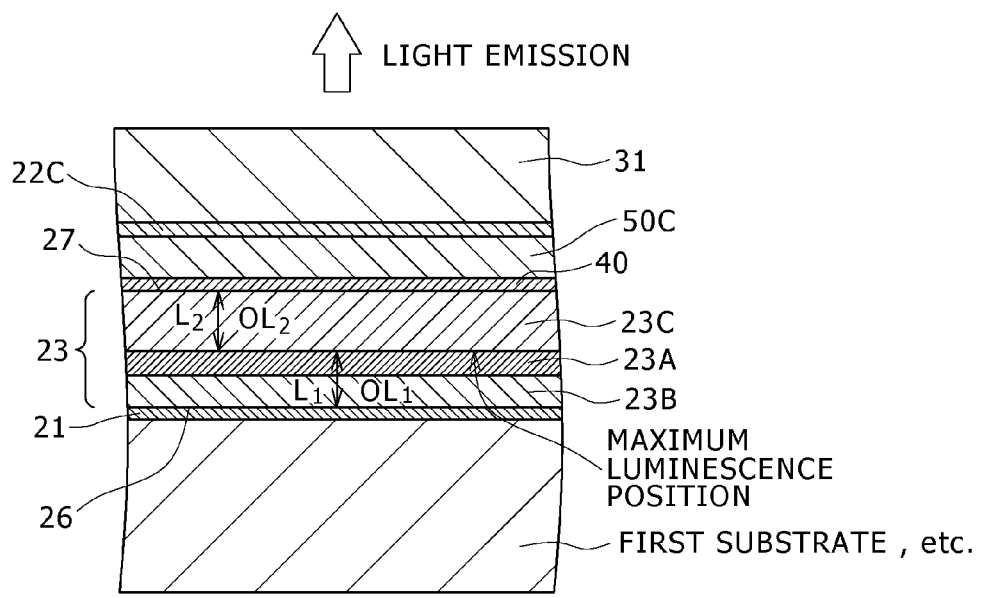
FIGS. 9A and 9B are schematic partial sectional views of a light emitting element in Example 4.
Figure 9B:
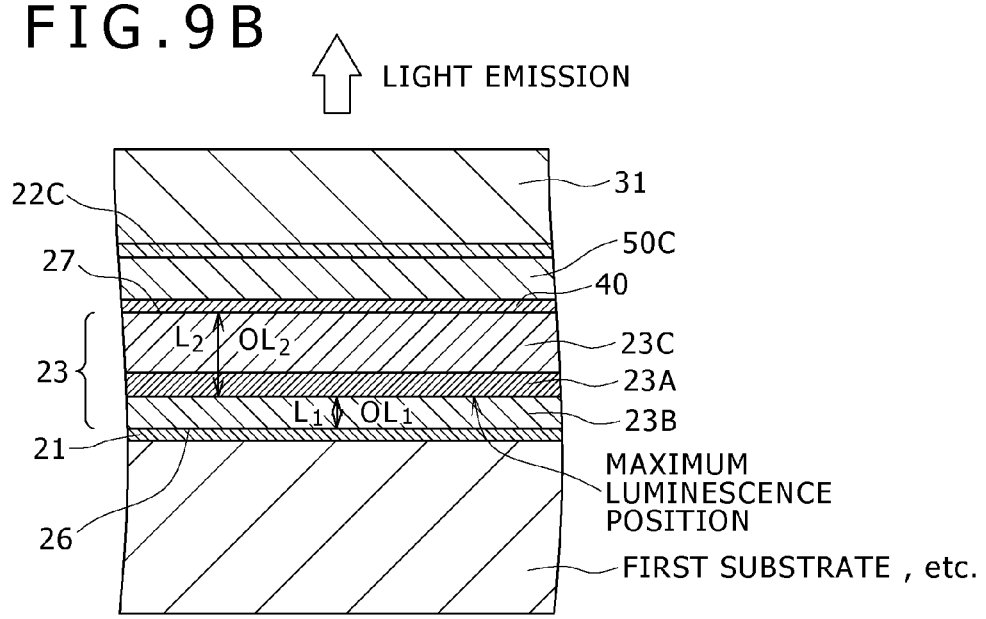

Example 4 relates to the light emitting element according to the third embodiment and the method of manufacturing the light emitting element according to the third embodiment. FIGS. 9A and 9B each show a schematic partial sectional view of the light emitting element in Example 4.

In Example 4, unlike in Example 1, formation of the conductive resin layer 60 was omitted. Further, unlike in Example 1, a resistance layer 50C was formed from a resin material having a high electric resistance (high-resistance resin material), specifically, a resin material obtained by admixing an acrylic adhesive with 30 to 50 wt % of polypyrrole as a conductive polymer. Here, the electric resistivity of the resin material constituting the resistance layer 50C is $1 \times 10^1$ to $1 \times 10^4$ Ω·m ($1 \times 10^3$ to $1 \times 10^6$ Ω·cm), specifically $5.6 \times 10^2$ Ω·m, and the thickness of the resistance layer 50C is $1 \times 10^{-6}$ to $1 \times 10^{-4}$ m, specifically, 10 μm.

Except for these points, the configurations and structures of the light emitting element and the organic EL display in Example 4 can be the same as the configurations and structures of the light emitting element and the organic EL display in Example 1, so that detailed descriptions of the same points are omitted. Now, the method of manufacturing the light emitting element in Example 4 will be described below.

[Step 400]

First, in the same manner as in [Step 100A] to [Step 100F] of Example 1, a first substrate 11 provided sequentially with first electrodes 21 and an organic layer 23 is prepared.

[Step 410]

On the other hand, in the same manner as in [Step 110] of Example 1, a second substrate 31 provided with a second electrode 22C is prepared. Specifically, the second electrode 22C, specifically an ITO layer having a thickness of 0.1 μm, is formed over the whole surface of a display region on the second substrate 31, based on a lift-off method including a sputtering method. Incidentally, in this step, a bus electrode composed of aluminum, for example, may be formed on such a region of the second substrate 31 as not to block the light emitted from the organic layer 23 (specifically, on a region between the second substrate 33 and the second electrode 22C).

[Step 420]

Then, an organic layer 23 and the second electrode 22C are adhered to each other through a resistance layer 50C composed of a resin material having a high electric resistance. Specifically, the resin material having a high electric resistance is formed on the organic layer 23 based on an ODF system, the resistance layer 50C and the second electrode 22C are stacked on each other, and the resin material constituting the resistance layer 50C is heated, whereby the organic layer 23 and the second electrode 22C are adhered to each other through the resistance layer 50C. Or, alternatively, the organic layer 23 and the second electrode 22C are stacked over each other, with a resistance layer 50C composed of a sheet-like material therebetween, and the resin material constituting the resistance layer 50C is heated, whereby the organic layer 23 and the second electrode 22C are adhered to each other through the resistance layer 50C.

In the light emitting element in Example 4, the resistance layer is composed of the resin material having a high electric resistance (a high-resistance resin material). Therefore, it is unnecessary to form the resistance layer in an especially enlarged thickness for enhancing coverage, so that an increase in the load on a process basis can be avoided, and an increase in manufacturing cost can be obviated. Besides, in the method of manufacturing the light emitting element in Example 4, the organic layer and the second electrode are adhered to each other through the resistance layer composed of the resin material having a high electric resistance, so that excellent coverage can be achieved.

EXAMPLE 5

Example 5, which is a modification of Example 4, relates to the method of manufacturing the light emitting element according to the 3'-th embodiment. In Example 5, a resistance layer 50C was formed from a resin material having a high electric resistance (a high-resistance resin material), specifically a resin material obtained by admixing an acrylic adhesive with 30 to 50 wt % of polypyrrole as a conductive polymer and with 0.3 wt % of N,N'-methylenebisacrylamide as a crosslinking agent, and gelling the admixture. Here, the electric resistivity of the resin material having a high electric resistance is specifically $4.8 \times 10^2$ Ω·m, and the thickness of the resistance layer 50C is specifically 10 µm.

Except for these points, the configurations and structures of the light emitting element and the organic EL display in Example 5 can be the same as the configurations and structures of the light emitting element and the organic EL display in Example 4, so that detailed descriptions of the same points are omitted.

In Example 5, the resistance layer is preliminarily formed on a second substrate in a step similar to [Step 420] of Example 4. Specifically, the resistance layer is formed on a second electrode based on an ODF system, then the resistance layer and an organic layer are stacked on each other, and the resin material constituting the resistance layer is heated, whereby the organic layer and the second electrode are adhered to each other through the resistance layer. In Example 5, since the resistance layer is preliminarily formed on the second electrode, the range of material selection for the resin material constituting the resistance layer is broadened.

EXAMPLE 6

Figure 10:
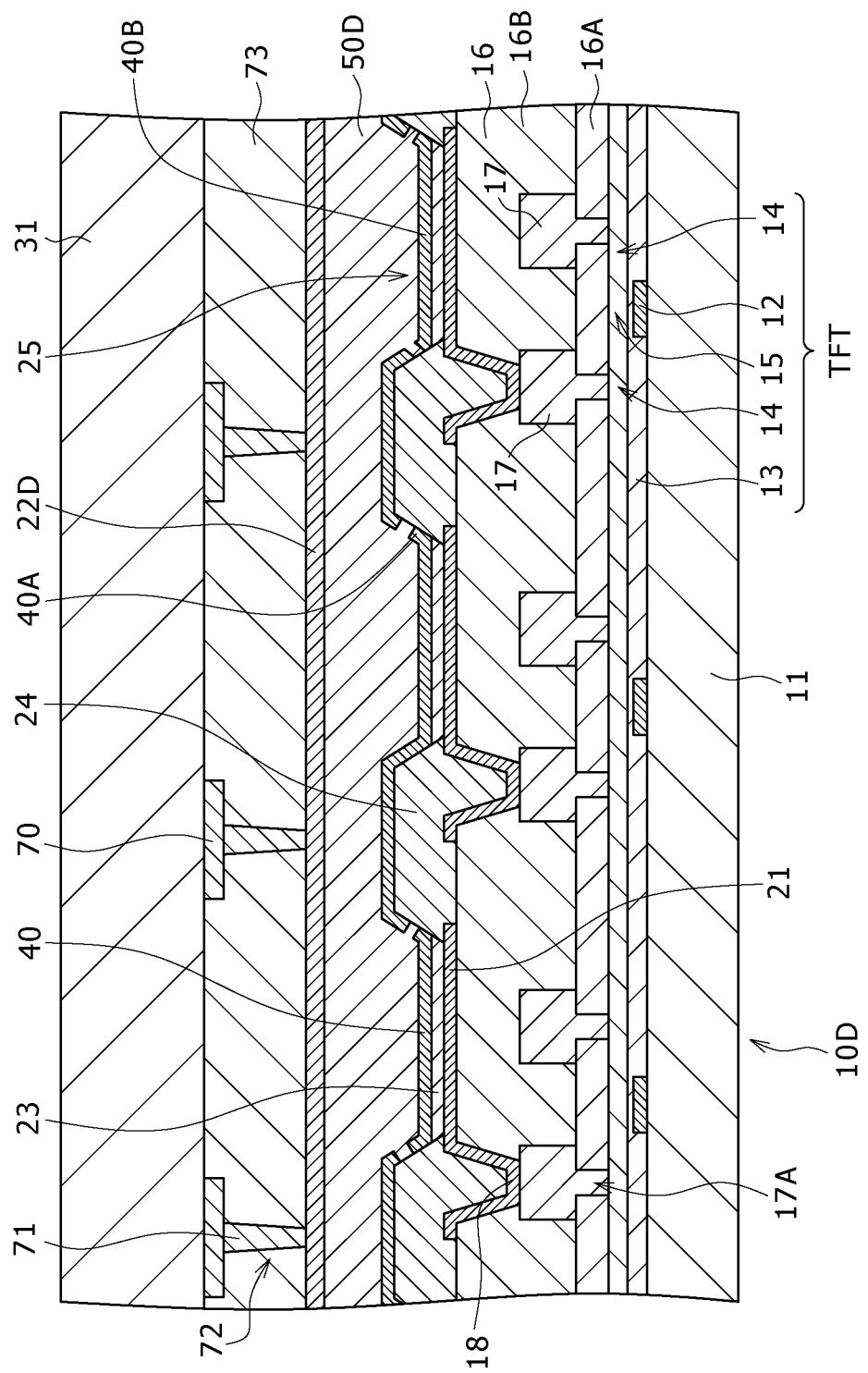
FIG. 10 is a schematic partial sectional view of an organic electroluminescence display in Example 6.

Example 6 relates to the light emitting element according to the fourth embodiment and the method of manufacturing the light emitting element according to the fourth embodiment. FIG. 10 shows a schematic partial sectional view of an organic electroluminescence display in Example 6, and FIGS. 11A and 11B each show a schematic partial sectional view of a light emitting element 10D in Example 6.

In Example 6, unlike in Example 1, formation of a conductive resin layer 60 was omitted. Besides, auxiliary electrodes 70 are formed on the upper side of a second electrode 22D, and the auxiliary electrode 70 and the second electrode 22 are electrically interconnected through a conductive rib 71. In addition, the auxiliary electrodes 70 and the second electrode 22 are connected to an external circuit.

Here, the conductive ribs 71 are fabricated by forming a conductive material film (not shown) composed of such a material as Al, Ag, Cu, Ti, W, Ta, Mo, ITO, IZO, $SnO_2$, ZnO:Al, etc. on surfaces of ribs (e.g., 5 µm in height) formed of a polyimide resin or an acrylic resin. The auxiliary electrodes 70 are formed of aluminum (Al) in a thickness of 1 µm, and are formed on such regions of the second substrate 31 as not to block the light emitted from the organic layer 23.

The space 72 between the second substrate 31 and the second electrode 22D may filled up with an adhesive layer (sealing layer) 73 of a thermosetting adhesive such as acrylic adhesive, epoxy adhesive, urethane adhesive, silicone adhesive, cyanoacrylate adhesive, etc. or a UV-curing adhesive, or may be filled up with an inert gas such as nitrogen gas.

Except for these points, the configurations and structures of the light emitting element and the organic EL display in Example 6 can be the same as the configurations and structures of the light emitting element and the organic EL display in Example 1, so that detailed descriptions of the same points are omitted. Now, the method of manufacturing the light emitting element in Example 6 will be described below.

[Step 600]

First, a first substrate 11 provided sequentially with first electrodes 21, an organic layer 23, a resistance layer 50D and the second electrode 22D is prepared. Specifically, in the same manner as [Step 100] (specifically, [Step 100A] to [Step 100G]) of Example 1, the first substrate 11 provided sequentially with the first electrodes 21 and the organic layer 23 and the resistance layer 50D is prepared. Next, the second electrode 22D is formed over the whole surface of a display region. The second electrode 22D is covering the entire surface of the organic layer 23 constituting N×M organic EL elements. It is to be noted here that the second electrode 22D is insulated from the first electrodes 21 by the resistance layer 50D, the organic layer 23 and an insulating layer 24. The second electrode 22D is formed based on a long throw magnetron sputtering process, which is a film forming method such that the energy of film-forming particles is so low as not to influence the organic layer 23. In addition, the steps up to the formation of the second electrode 22D are continuously carried out in the same vacuum evaporation system as that for formation of the organic layer 23 without exposing the organic layer 23 to the atmospheric air, whereby the organic layer 23 can be prevented from being deteriorated due to moisture or oxygen in the air. Specifically, an ITO layer having a thickness of 0.1 µm is formed over the entire surface, whereby the second electrode 22D can be obtained.

[Step 610]

On the other hand, the second substrate 31 provided with the auxiliary electrodes 70 and provided further with the conductive ribs 71 on the auxiliary electrodes 70 is prepared. Specifically, the auxiliary electrodes 70, specifically an aluminum (Al) layer of 1 µm in thickness is formed over the whole surface of the display region of the second substrate 31, based on a lift-off method including a sputtering method. Thereafter, ribs composed of a polyimide resin or an acrylic resin are provided, and then the conductive ribs 71 are formed on the auxiliary electrode 70, based on a sputtering method, a plasma enhanced CVD method, an EB evaporation method or the like.

[Step 620]

Thereafter, the first substrate 11 and the second substrate 31 are joined to each other in the condition where the ribs 71 and the second electrode 22D are in contact with each other. Specifically, a peripheral portion of the first substrate 11 and/or a peripheral portion of the second substrate 31 is coated with frit glass, and the frit glass is subjected to preliminary drying. Then, the first substrate 11 and the second substrate 31 are stacked in such a manner that the ribs 71 and the second electrode 22D are in contact with each other. The assembly is fed into a nitrogen gas atmosphere, for example, and burning of the frit glass is conducted, whereby the first substrate 11 and the second substrate 31 are joined to each other.

In the light emitting element in Example 6, the auxiliary electrode 70 is formed on the upper side of the second electrode 22D, and the auxiliary electrode 70 and the second electrode 22D are electrically interconnected by the conductive rib 71. Therefore, a reduction in the manufacturing cost of the second electrodes 22D and the auxiliary electrodes 70 and the ribs 71 as a whole can be promised, as compared with the case where the second electrode is composed of a transparent conductive material such as ITO. In addition, in the method of manufacturing the light emitting elements in Example 6, the first substrate 11 and the second substrate 31 are joined to each other in the condition where the ribs 71 and the second electrode 22D are in contact with each other, so that a reduction in the manufacturing cost of the second electrode 22D and the auxiliary electrodes 70 and the ribs 71 as a whole can be contrived.

EXAMPLE 7

Example 7, which is a modification of Examples 1 to 3 and Example 6, relates to a configuration in which a resistance layer has a stacked structure of a first resistance layer and a second resistance layer in this order from the organic layer side, and the second resistance layer is higher than the first resistance layer in electric resistivity. In Example 7, the first resistance layer and the second resistance layer are both composed of $Nb_2O_5$. However, by changing the oxygen partial pressure at the time of forming the layers of $Nb_2O_5$ by a sputtering method, the electric resistivity values $R_1$ and $R_2$ of the first resistance layer and the second resistance layer were set as follows.

Electric resistivity $R_1$ of first resistance layer:

$1 \times 10^2 \, \Omega \cdot m (1 \times 10^4 \, \Omega \cdot cm)$

Electric resistivity $R_2$ of second resistance layer:

$1 \times 10^4 \, \Omega \cdot m (1 \times 10^6 \, \Omega \cdot cm)$

Measurement of a voltage drop across the resistance layer showed that it was possible in Example 7 to reduce the voltage drop and thereby to lower the driving voltage, as compared with the case where the resistance layer is composed of a single layer (electric resistivity: $1 \times 10^4 \, \Omega \cdot m$ ($1 \times 10^6 \, \Omega \cdot cm$)).

Except for the difference in the configuration of the resistance layer, the configurations and structures of the organic EL display and the light emitting element or organic EL element in Example 7 can be the same as the configurations and structures of the organic EL display and the light emitting element or organic EL element in Examples 1 to 3 and Example 6. Therefore, detailed descriptions of the same points are omitted.

EXAMPLE 8

Example 8 is a modification of Examples 1 to 6. In Examples 1 to 6, the electric resistance (electric resistance per unit area of the resistance layer, here and hereafter) $R_R$ of the resistance layer constituting the red light emitting element, the electric resistance $R_G$ of the resistance layer constituting the green light emitting element, and the electric resistance $R_B$ of the resistance layer constituting the blue light emitting element were set to be equal. In other words, the whole surface was covered uniformly with the resistance layer. Meanwhile, in general, the optical distance $OL_B$ in the blue light emitting element with a short emission wavelength is shorter than the optical distances $OL_G$ and $OL_R$ in the green light emitting element and the red light emitting element with longer emission wavelength. Therefore, it may be necessary to set the thickness of the organic layer in the blue light emitting element to be smaller than the thicknesses of the organic layers in the green light emitting element and the red light emitting element. This results in that short circuiting is most liable to occur between the first electrode and the second electrode in the blue light emitting element, and, accordingly, the thickness of the resistance layer has to be the greatest in the blue light emitting element. On the other hand, depending on the materials constituting the respective light emitting elements and the thickness of the organic layer, in general, the driving voltages for the blue light emitting element, the green light emitting element and the red light emitting element tend to become higher in the order of the blue light emitting element, the red light emitting element and the green light emitting element. In this case, however, it is preferable that the driving voltages for the blue light emitting element, the green light emitting element and the red light emitting element are as close to one another as possible. Besides, where the driving voltages for the blue light emitting element, the green light emitting element and the red light emitting element are scattered, it is preferable to minimize the scattering of the driving voltage. Further, where there are differences in pixel area, for example, where [pixel area of red light emitting element]≤ [pixel area of green light emitting element]<[pixel area of blue light emitting element], the number of dark spots tends to be greater as the pixel area is larger.

Figure 12:
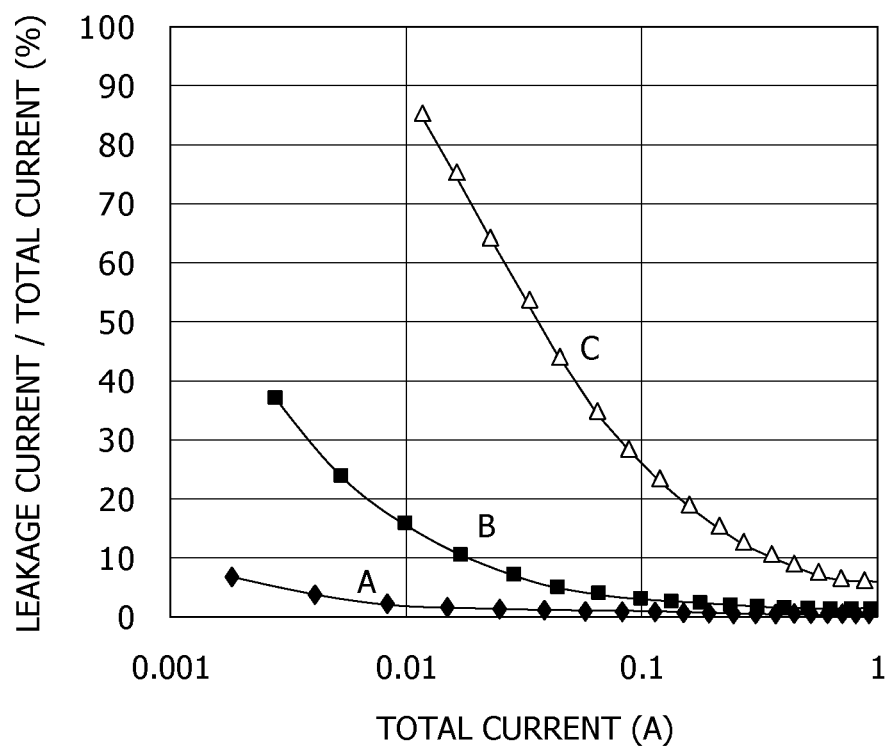
FIG. 12 is a graph showing the results of a simulation of the proportion of variations in leakage current to total current when the total current for driving a pixel is varied.

FIG. 12 shows the results of a simulation of the proportion of variations in leakage current to total current when the total current for driving a pixel is varied. The simulation results show that as the total current decreases, the proportion of the leakage current due to a foreign matter increases. It is further seen that as the resistance of the resistance layer increases, the leakage current is more suppressed. Incidentally, in FIG. 12, curve "A" shows data obtained when the resistance of the resistance layer is $1 \times 10^4 \Omega$, while curve "B" shows data obtained when the resistance of the resistance layer is $1 \times 10^5 \Omega$, and curve "C" shows data obtained when the resistance of the resistance layer is $1 \times 10^6 \Omega$.

In Example 8, in order that the driving voltages for the blue light emitting element, the green light emitting element and the red light emitting element are as close to one another as possible, a configuration is adopted in which the resistance $R_R$ per unit area of the resistance layer constituting the red light emitting element, the resistance $R_G$ per unit area of the resistance layer constituting the green light emitting element, and the resistance $R_B$ per unit area of the resistance layer constituting the blue light emitting element are different. Specifically, the resistance values are so set that $R_B > R_G$ and $R_B > R_R$. More specifically, $R_B = 150 \, \Omega \cdot cm^2$, $R_G = 50 \, \Omega \cdot cm^2$, and $R_R = 100 \, \Omega \cdot cm^2$.

This makes it possible to set the driving voltages for the blue light emitting element, the green light emitting element and the red light emitting element as close to one another as possible, to minimize the rises in the driving voltages, and to securely restrain the generation of short circuit between the first electrode and the second electrode.

For instance, the thickness of the resistance layer constituting the red light emitting element, the thickness of the resistance layer constituting the green light emitting element, and the thickness of the resistance layer constituting the blue light emitting element were set to be different. Specifically, after formation of the resistance layer, the resistance layer for constituting the blue light emitting element is covered with a resist layer, whereas the resistance layer for constituting the green light emitting element and the red light emitting element is exposed, and the resistance layer for constituting the green light emitting element and the red light emitting element is partly etched in the thickness direction. Next, the resist layer is removed, the resistance layer for constituting the blue light emitting element and the red light emitting element is covered with a resist layer, whereas the resistance layer for constituting the green light emitting element is exposed, and the resistance layer for constituting the green light emitting element is partly etched in the thickness direction. Or, alternatively, the material for forming the resistance layer constituting the red light emitting element, the material for forming the resistance layer constituting the green light emitting element, and the material for forming the resistance layer constituting the blue light emitting element may be set to be different (for instance, in Example 7, after formation of the first resistance layer and the second resistance layer, the portions of the second resistance layer for constituting the red light emitting element and the green light emitting element are etched away). Or, the content of a substance contributing to conductivity in the resistance layer constituting the red light emitting element, the content of a substance contributing to conductivity in the resistance layer constituting the green light emitting element, and the content of a substance contributing to conductivity in the resistance layer constituting the blue light emitting element may be set to be different.

EXAMPLE 9

Figure 13:
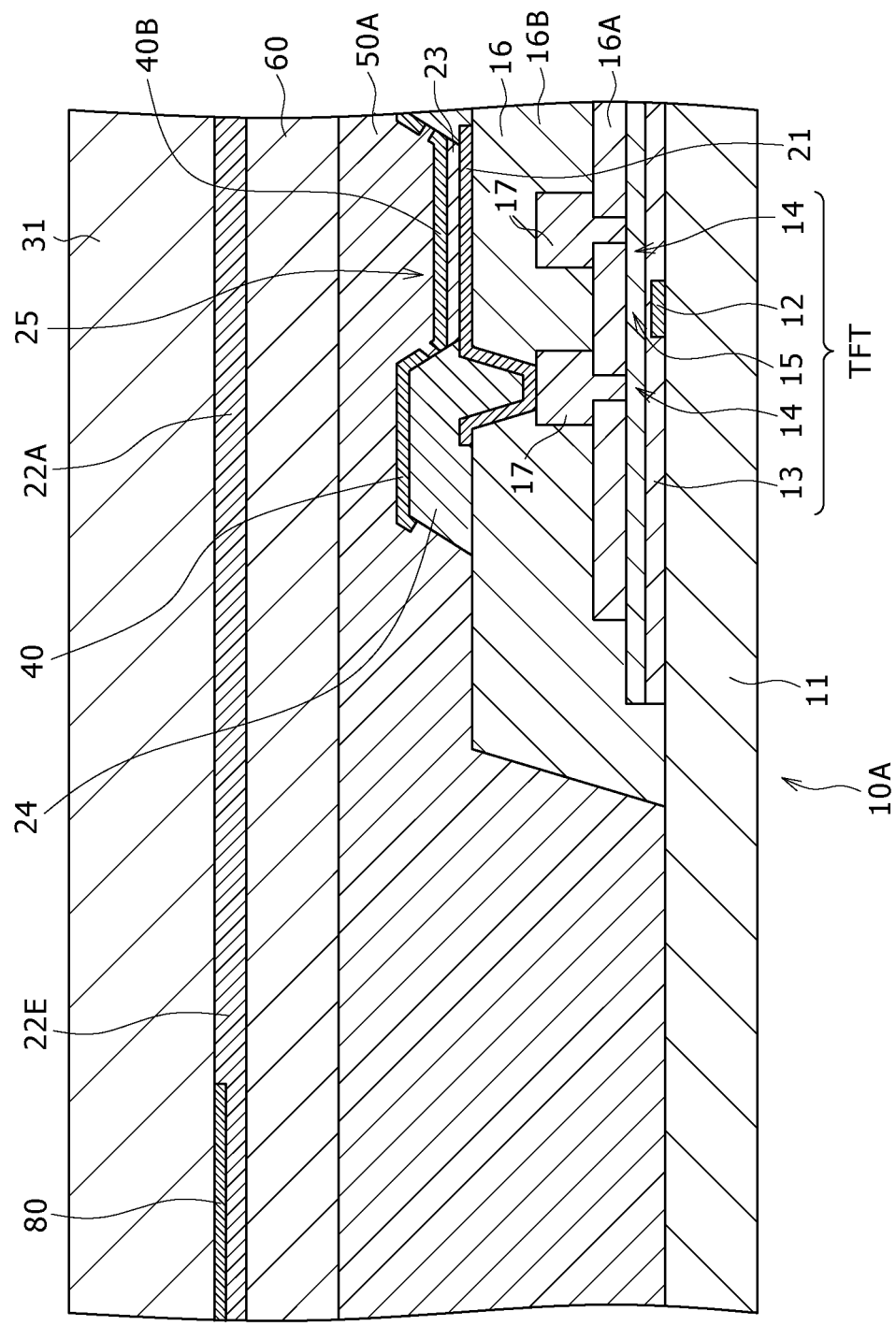
FIG. 13 is a schematic partial sectional view of the vicinity of a peripheral part of an organic electroluminescence display in Example 9.
Figure 14:
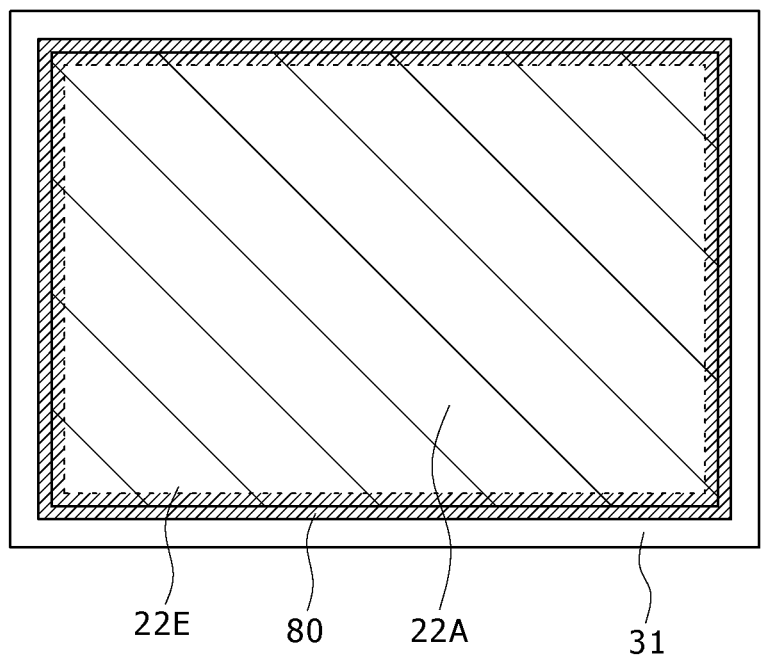
FIG. 14 is a view showing schematically the layout of a lead-out electrode and second electrodes in the vicinity of a peripheral part of the organic electroluminescence display in Example 9.

Example 9 also is a modification of Examples 1 to 6. In Example 9, a lead-out electrode 80 for connecting the second electrodes 22A, 22B, 22C, 22D to an external circuit (not shown) is provided in a peripheral region of the organic EL display. In Example 9, the lead-out electrode 80 is provided on a peripheral portion of the first substrate 11, and is composed of titanium (Ti). Extension parts 22E of the second electrodes are extending to the upper side of the lead-out electrode 80. A schematic partial sectional view of the vicinity of the peripheral part of the organic EL display (represented by the organic EL display described in Example 1 above) in Example 9 is shown in FIG. 13, and the arrangement of the lead-out electrode 80 and the second electrodes 22A in the vicinity of the peripheral part is schematically shown in FIG. 14. Incidentally, in FIG. 14, the outer periphery of the lead-out electrode 80 is indicated by solid lines, the inner periphery is indicated by dotted lines, and, for making clear the lead-out electrode 80, the lead-out electrode 80 is hatched with straight lines extending from the right upper side toward the left lower side. On the other hand, for making clear the second electrodes 22A inclusive of the extension parts 22E, the second electrodes 22A are hatched with straight lines extending from the left upper side toward the right lower side. The lead-out electrode 80 may be formed so as to surround the display region in the manner of a picture frame, for example, based on a combination of a sputtering process and an etching process, a PVD method using a metal mask, a lift-off method, or the like in, for example, any one of [Steps 100] in Example 1. Incidentally, in the case where the lead-out electrode 80 overlaps with various wirings or the like provided on the first substrate 11, in some areas, an insulating film or films may be formed between the lead-out electrode 80 and the various wirings or the like.

The configurations and structures of the light emitting elements or organic EL elements and the organic EL displays in the Examples above and the materials and the like constituting the light emitting elements or organic EL elements and the organic EL displays in the Examples are mere examples, and they can be modified, as required.

For instance, a configuration may be adopted in which a conductor film is provided between the first electrodes and the organic layer, and the mean thickness of the conductor film on the upper side of the first electrode is 1 to 6 nm. The conductor film may be formed, for example, by use of the same material as the material of the semitransmitting-reflective film. Specific examples of the material include a material containing an alkali metal or alkaline earth metal and silver (Ag) [e.g., magnesium (Mg) and silver (Ag)], and a material containing magnesium (Mg) and calcium (Ca) [e.g., Mg—Ag or Mg—Ca]. Or, the semitransmitting-reflective film may be formed of aluminum (Al) or silver (Ag). Where magnesium-silver is used, the volume ratio Mg:Ag of magnesium to silver may be, for example, in the range from 5:1 to 30:1. On the other hand, where magnesium-calcium is used, the volume ratio Mg:Ca of magnesium to calcium may be, for example, in the range from 2:1 to 10:1.

While the second substrate was disposed on the upper side of the second electrode in the above Examples, an alternate arrangement obtained by reversing the stacking order as shown in Table 7 below may be adopted, in which the first substrate is disposed on the lower side of the second electrode and the light generated in the light emitting layer is emitted out through the first substrate. Incidentally, while Table 7 shows an example of application of the configuration and structure corresponding to the light emitting element described in Example 1 above, the configuration and structure corresponding to other Example may naturally be applied. Or, the stacked arrangement state of the layers in the organic layer can be reversed upside down. Specifically, an arrangement may be adopted in which a stacked structure include the electron transport layer, the light emitting layer, the hole transport layer and the hole injection layer in this order from the first electrode side, and the resistance layer is formed on or over the hole injection layer.

TABLE 7

| | |
|---|---|
| Second substrate 31 | Soda glass |
| Adhesive layer | Acrylic adhesive |
| Protective film | $SiN_x$ layer (5 μm thick) |
| First electrode (anode) 21 | Al—Nd layer (0.2 μm thick) |
| Organic layer 23 | As above-mentioned |
| Electron injection layer | LiF layer (0.3 nm thick) |
| Semitransmitting-reflective film 40 | Mg—Ag layer (5 nm thick) |
| Resistance layer 50A | $Nb_2O_5$ layer (0.5 μm thick) |
| Conductive resin layer 60 | (10 μm thick) |
| Second electrode (Cathode) 22A | ITO layer (0.1 μm thick) |
| Interlayer insulating layer 16 | $SiO_2$ layer |
| TFT | Constituting an organic EL element driving part |
| First substrate 11 | Soda glass |

While the organic layer was formed on a light emitting element basis in the above Examples, a structure may in some cases be adopted in which an organic layer constituting the blue light emitting element extends to the upper side of the red light emitting element and the green light emitting element. Incidentally, the extension parts of the organic layer constituting the blue light emitting element are referred to as "common layer," for convenience. In other words, a form may be adopted in which the organic layer for constituting the blue light emitting elements is formed over the whole surface of the display region. In this case, the red light emitting element is provided with a stacked structure of the organic layer for emitting red light and the common layer, and, yet, red light is emitted when a current is made to flow between the first electrode and the second electrode. Similarly, the green light emitting element is provided with a stacked structure of the organic layer for emitting green light and the common layer, and, yet, green light is generated when a current is made to flow between the first electrode and the second electrode. Such a configuration ensures that the blue light emission energy generated in the common layer is moved into the red light emitting organic layer and the green light emitting organic layer, whereby the luminous efficiencies of the red light emitting organic layer and the green light emitting organic layer can be enhanced. In addition, where the common layer is formed over the entire area of the light emitting layer in the red light emitting organic layer and the light emitting layer in the green light emitting organic layer, the light emitting layer for constituting the blue light emitting organic layer can be formed without forming it on an individual basis. Thus, for example, the need for a mask for forming the light emitting layer to constitute the blue light emitting organic layer is eliminated, and mass producibility is enhanced.

Figure 15A:
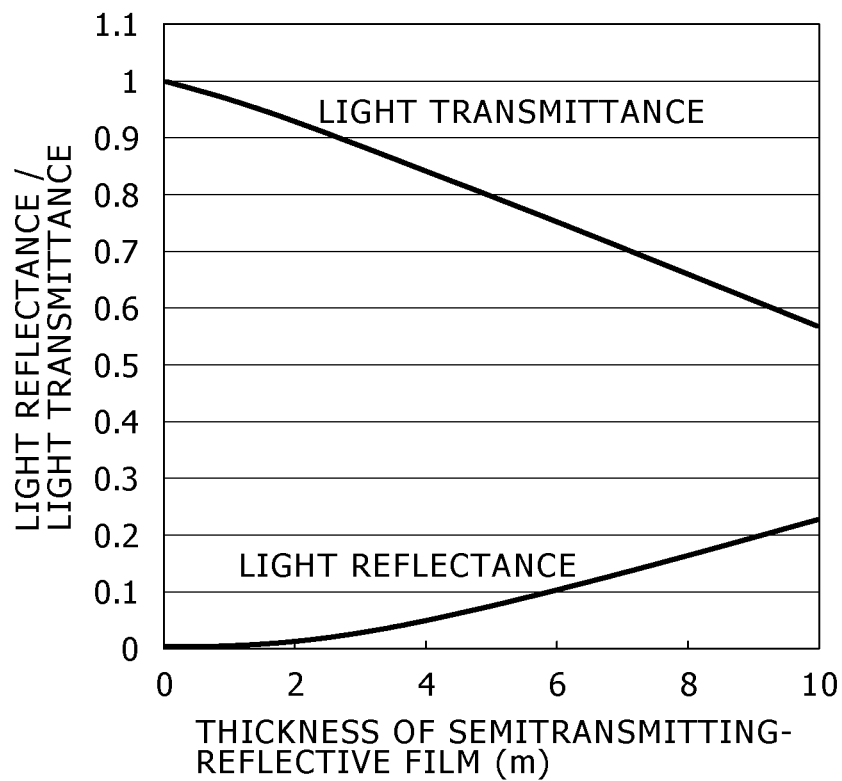
FIGS. 15A and 15B are respectively a graph showing the relationship between thickness of a semitransmitting-reflective film and mean reflectance and a graph showing the relationship between mean reflectance and refractive index difference at an interface between two layers having different refractive indexes in the condition where the two layers are stacked on each other.
Figure 15B:
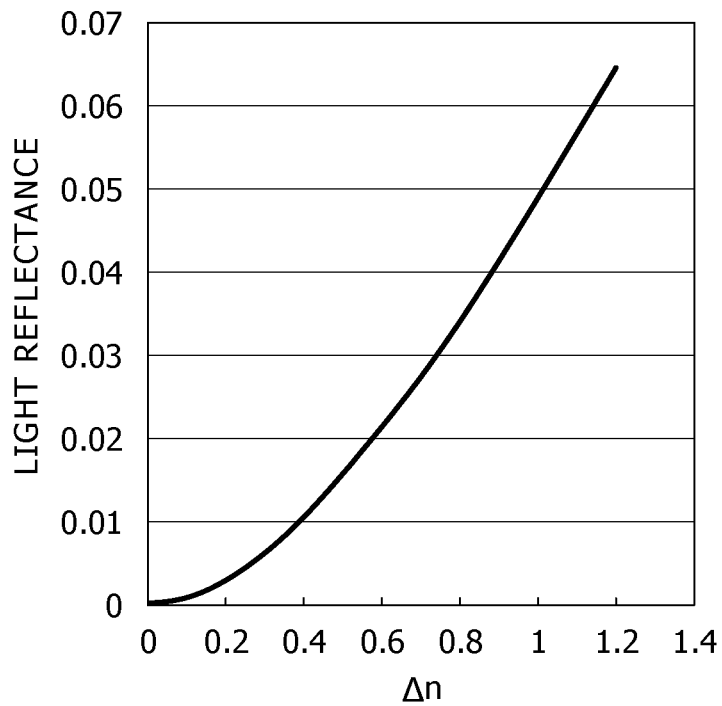
Figure 16:
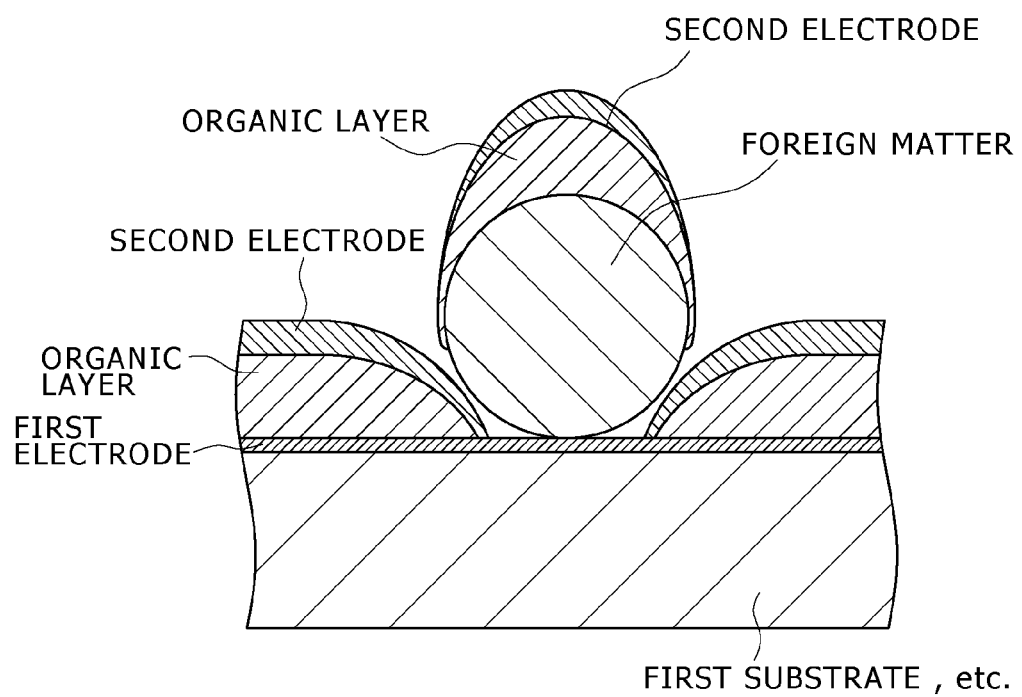
FIG. 16 is a partial sectional view showing schematically the formed states of an organic layer and the like when a foreign matter (particle) is present on a first electrode, in an organic electroluminescence display according to a related art.

FIG. 15A shows the relationship between thickness of the semitransmitting-reflective film 40 and mean light reflectance at a wavelength of 530 nm. As shown in the figure, the mean light reflectance approaches zero (0) as the thickness of the semitransmitting-reflective film 40 decreases. Therefore, when the thickness of the semitransmitting-reflective film 40 decreases, the semitransmitting-reflective film 40 comes to be transmit most of the light therethrough. In addition, FIG. 15B shows as an example the relationship between mean light reflectance, when light of a wavelength of 530 nm incident from a layer A to a layer B adjacent to the layer A is reflected at the interface between the layer A and the layer B, and difference Δn between the refractive index of the material constituting the layer A and the refractive index of the material constituting the layer B. As shown in the figure, the value of the mean light reflectance increases as the value of Δn increases, based on the Fresnel reflection.

Therefore, when the thickness of the semitransmitting-reflective film 40 is decreased and the semitransmitting-reflective film 40 comes to transmit most of the light therethrough, reflection occurs at the third interface composed of the interface between the semitransmitting-reflective film 40 and the resistance layer 50. Or, where the resistance layer 50 has a stacked structure of at least two resistance layers, reflection occurs mainly at the fourth interface composed of the interface between the first resistance layer and the second resistance layer, depending on the materials constituting the semitransmitting-reflective film 40 and the resistance layer having the stacked structure, or the like factors. As a result, the light emitted from the light emitting layer can be resonated between the first interface and the third interface which is composed of the interface between the semitransmitting-reflective film 40 and the resistance layer 50. Alternatively, the light emitted from the light emitting layer can be resonated between the first interface and the fourth interface which is composed of the interface between the first resistance layer and the second resistance layer. Or, the light emitting from the light emitting layer can be resonated between the first interface and the third interface, and the light emitted from the light emitting layer can be resonated between the first interface and the fourth interface.

In such a case, therefore, the optical distance from the third or fourth interface to the maximum luminescence position in the light emitting layer may be let be $OL_2$, instead of letting the optical distance from the second interface to the maximum luminescence position in the light emitting layer be $OL_2$. In addition, $\Phi_2$ may be the phase shift amount (unit: radian) [provided that $-2\pi<\Phi_2\leq 0$] of reflected light generated at the third interface or the fourth interface. Or, the optical distance from the third or fourth interface may be let be OL and the sum of phase shifts generated when the light generated in the light emitting layer is reflected on the first interface and the third or fourth interface may be let be Φ radian [provided that $-2\pi<\Phi\leq 0$], instead of letting the optical distance from the second interface be OL and letting the sum of phase shifts generated when the light generated in the light emitting layer is reflected on the first interface and the second interface be Φ radian [provided that $-2\pi<\Phi\leq 0$]. As above-mentioned, in the case where reflection occurs mainly at the third interface which is the interface between the semitransmitting-reflective film and the resistance layer or where reflection occurs mainly at the fourth interface which is the interface between the first resistance layer and the second resistance layer, the expression "the second interface composed of the interface between the semitransmitting-reflective film and the organic layer" may be read as "the third interface which is the interface between the semitransmitting-reflective film and the resistance layer" or "the fourth interface which is the interface between the first resistance layer and the second resistance layer."

Specifically, as a modification example of the light emitting element in Example 1, a light emitting element having the structure as shown in Table 8 below in which the resistance layer is a combination of a first resistance layer and a second resistance layer, was fabricated. In this case, reflection occurred at the third interface which is the interface between the semitransmitting-reflective film and the resistance layer and at the fourth interface which is the interface between the first resistance layer and the second resistance layer. Consequently, the luminous efficiency was 1.3 times that in the case of a light emitting element in which the resistance layer was composed only of the second resistance layer. Incidentally, the refractive index $n_1$ of the material constituting the first resistance layer, the refractive index $n_2$ of the material constituting the second resistance layer, and the refractive index $n_0$ of the material constituting the uppermost layer of the organic layer were in such a relation as to emphasize efficiency, that is:

$-0.6 \leq n_0 - n_1 \leq -0.4$, and $0.4 \leq n_1 - n_2 \leq 0.9$.

TABLE 8

| | |
|---|---|
| Second substrate | Soda glass |
| Second electrode (Cathode) | ITO layer (0.1 μm thick) |
| Conductive resin layer | (10 μm thick) |
| Second resistance layer | 0.5 μm thick (refractive index $n_2$: 1.7) |

TABLE 8-continued

| First resistance layer | 0.06 μm thick (refractive index $n_1$: 2.4) |
|---|---|
| Semitransmitting-reflective film | Mg—Ag film (2 nm thick) |
| Organic layer (whole) | 130 nm thick (refractive index $n_9$: 1.8) |
| First electrode | Al—Nd layer (0.2 μm thick) |
| Interlayer insulating layer | $SiO_2$ layer |
| TFT | Constituting an organic EL element driving part |
| First substrate | Soda glass |

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A light emitting element comprising:
   a substrate;
   a first electrode formed directly on the substrate;
   an organic layer formed on the first electrode;
   a resistance layer formed on the organic layer;
   a second electrode; and
   a conductive resin layer formed between the resistance layer and the second electrode,
   wherein in a thickness direction of the light emitting element, portions of the resistance layer are formed both above and below a portion of the organic layer.

2. The light emitting element according to claim 1, wherein the conductive resin layer has an electrical resistivity ranging from about $1 \times 10^{-4}$ to about $1 \times 10^2$ Ωm.

3. The light emitting element according to claim 1, wherein the conductive resin layer has a thickness ranging from about $1 \times 10^{-6}$ to about $1 \times 10^{-4}$ m.

4. The light emitting element according to claim 1, wherein the resistance layer has an electrical resistivity ranging from about $1 \times 10^2$ to about $1 \times 10^6$ Ωm.

5. The light emitting element according to claim 1, wherein the resistance layer has a thickness ranging from about 0.1 to about 2 μm.

6. The light emitting element according to claim 1, wherein the organic layer includes at least one discontinuity, and at least a portion of the resistance layer is formed in a space between the discontinuous portions of the organic layer.

7. The light emitting element according to claim 1, wherein the organic layer includes at least one discontinuity, and the first and second electrodes are continuously formed across the discontinuity in the organic layer.

8. The light emitting element according to claim 1, wherein the first electrode is an anode and the second electrode is a cathode.

9. A method of manufacturing a light emitting element, the method comprising:
   forming a first section by
      forming a first electrode directly on a substrate,
      forming an organic layer on the first electrode, and
      forming a resistance layer on the organic layer;
   forming a second section by
      forming a second electrode; and
   joining the first and second sections by providing a conductive resin layer between the resistance layer and the second electrode,
   wherein in a thickness direction of the light emitting element, portions of the resistance layer are formed both above and below a portion of the organic layer.

10. The method of manufacturing the light emitting element according to claim 9, wherein the conductive resin layer has an electrical resistivity ranging from about $1 \times 10^{-4}$ to about $1 \times 10^2$ Ωm.

11. The method of manufacturing the light emitting element according to claim 9, wherein the conductive resin layer has a thickness ranging from about $1 \times 10^{-6}$ to about $1 \times 10^{-4}$ m.

12. The method of manufacturing the light emitting element according to claim 9, wherein the resistance layer has an electrical resistivity ranging from about $1 \times 10^2$ to about $1 \times 10^6$ Ωm.

13. The method of manufacturing the light emitting element according to claim 9, wherein the resistance layer has a thickness ranging from about 0.1 to about 2 μm.

14. A light emitting element comprising:
   a substrate;
   a first electrode formed directly on the substrate;
   an organic layer formed on the first electrode;
   a resistance layer formed on the organic layer; and
   a second electrode including a conductive resin material, the second electrode being formed on the resistance layer,
   wherein in a thickness direction of the light emitting element, portions of the resistance layer are formed both above and below a portion of the organic layer.

15. The light emitting element according to claim 14, wherein the conductive resin material has an electrical resistivity less than or equal to about $5 \times 10^{-3}$ Ωm.

16. The light emitting element according to claim 14, wherein the second electrode has a thickness ranging from about 1 to about 100 μm.

17. The light emitting element according to claim 14, wherein the resistance layer has an electrical resistivity ranging from about $1 \times 10^2$ to about $1 \times 10^6$ Ωm.

18. The light emitting element according to claim 14, wherein the resistance layer has a thickness ranging from about 0.1 to about 2 μm.

19. A method of manufacturing a light emitting element, the method comprising:
   forming a first section by
      forming a first electrode directly on a substrate,
      forming an organic layer on the first electrode, and
      forming a resistance layer on the organic layer;
   forming a second section by
      forming a second electrode on a substrate, the second electrode including a conductive resin material; and
   joining the first and second sections by connecting the second electrode to the resistance layer,.
   wherein in a thickness direction of the light emitting element, portions of the resistance layer are formed both above and below a portion of the organic layer.

20. The method of manufacturing the light emitting element according to claim 19, wherein the conductive resin material has an electrical resistivity less than or equal to about $5 \times 10^{-3}$ Ωm.

21. The method of manufacturing the light emitting element according to claim 19, wherein the second electrode has a thickness ranging from about 1 to about 100 μm.

22. The method of manufacturing the light emitting element according to claim 19, wherein the resistance layer has an electrical resistivity ranging from about $1 \times 10^2$ to about $1 \times 10^6$ Ωm.

23. The method of manufacturing the light emitting element according to claim 19, wherein the resistance layer has a thickness ranging from about 0.1 to about 2 µm.

24. A light emitting element comprising:
a substrate;
a first electrode formed directly on the substrate;
an organic layer formed on the first electrode;
a resistance layer including a high-resistance resin material, the resistance layer being formed on the organic layer; and
a second electrode formed on the resistance layer,
wherein in a thickness direction of the light emitting element, portions of the resistance layer are formed both above and below a portion of the organic layer.

25. The light emitting element according to claim 24, wherein the resistance layer has an electrical resistivity ranging from about $1\times10^1$ to about $1\times10^4$ Ωm.

26. The light emitting element according to claim 24, wherein the resistance layer has a thickness ranging from about $1\times10^{-6}$ to about $1\times10^{-4}$ m.

27. A method of manufacturing a light emitting element, the method comprising:
forming a first section by
forming a first electrode directly on a substrate,
forming an organic layer on the first electrode, and
forming a second section by
forming a second electrode; and
joining the first and second sections by providing a resistance layer including a high-resistance resin material between the organic layer and the second electrode,
wherein in a thickness direction of the light emitting element, portions of the resistance layer are formed both above and below a portion of the organic layer.

28. The method of manufacturing the light emitting element according to claim 27, wherein the resistance layer has an electrical resistivity ranging from about $1\times10^1$ to about $1\times10^4$ Ωm.

29. The method of manufacturing the light emitting element according to claim 27, wherein the resistance layer has a thickness ranging from about $1\times10^{-6}$ to about $1\times10^{-4}$ m.

30. A light emitting element comprising:
a substrate;
a first electrode formed directly on the substrate;
an organic layer formed on the first electrode;
a resistance layer formed on the organic layer;
a second electrode formed on the resistance layer;
an auxiliary electrode; and
a conductive rib formed between and electrically connecting the auxiliary electrode to the second electrode,
wherein in a thickness direction of the light emitting element, portions of the resistance layer are formed both above and below a portion of the organic layer.

31. The light emitting element according to claim 30, further comprising a semitransmitting-reflective film formed between the organic layer and the resistance layer.

32. The light emitting element according to claim 31, wherein the semitransmitting-reflective film has a thickness ranging from about 1 to about 6 nm.

33. A method of manufacturing a light emitting element, the method comprising:
forming a first section by
forming a first electrode directly on a substrate,
forming an organic layer on the first electrode,
forming a resistance layer on the organic layer, and
forming a second electrode on the resistance layer;
forming a second section by
forming at least one auxiliary electrode, and
forming a conductive rib on the auxiliary electrode; and
joining the first and second sections by connecting the conductive rib to the second electrode,
wherein in a thickness direction of the light emitting element, portions of the resistance layer are formed both above and below a portion of the organic layer.

34. The method of manufacturing the light emitting element according to claim 33, further comprising a semitransmitting-reflective film formed between the organic layer and the resistance layer.

35. The method of manufacturing light emitting element according to claim 34, wherein the semitransmitting-reflective film has a thickness ranging from about 1 to about 6 nm.

36. A light emitting element comprising:
a substrate;
a first electrode formed directly on the substrate;
an organic layer formed on the first electrode;
a second electrode; and
a conductive resin layer formed between the organic layer and the second electrode,
wherein in a thickness direction of the light emitting element, portions of a resistance layer are formed both above and below a portion of the organic layer.

37. A method of manufacturing a light emitting element, the method comprising:
forming a first section by
forming a first electrode directly on a substrate,
forming an organic layer on the first electrode; and
forming a second section by
forming a second electrode; and
joining the first and second sections by providing a conductive resin material between the organic layer and the second electrode,
wherein in a thickness direction of the light emitting element, portions of a resistance layer are formed both above and below a portion of the organic layer.

38. A light emitting element comprising:
a substrate;
a first electrode formed on the substrate;
an organic layer formed on the first electrode;
a resistance layer formed on the organic layer;
a second electrode; and
a conductive resin layer formed between the resistance layer and the second electrode,
wherein the organic layer includes at least one discontinuity, and the first and second electrodes are continuously formed across the discontinuity in the organic layer.

* * * * *